US012575067B2

(12) United States Patent
Gil et al.

(10) Patent No.: US 12,575,067 B2
(45) Date of Patent: Mar. 10, 2026

(54) REPROGRAMMABLE SMART ACTUATOR OR REFRIGERATED CABINET WITH WEB SERVER

(71) Applicant: Johnson Controls Tyco IP Holdings LLP, Milwaukee, WI (US)

(72) Inventors: Stéphane Norbert Marcel Gil, Monza (IT); Alessandro Bonfanti, Milian (IT); Alejandro Gonzalez Pozo, Barcelona (ES); Keith Herbert Gifford, Milwaukee, WI (US); Bernard Philippe Clement, Mequon, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 534 days.

(21) Appl. No.: 17/552,119

(22) Filed: Dec. 15, 2021

(65) Prior Publication Data

US 2023/0189483 A1     Jun. 15, 2023

(51) Int. Cl.
*H05K 7/20* (2006.01)
*F25B 49/00* (2006.01)

(52) U.S. Cl.
CPC ......... *H05K 7/20736* (2013.01); *F25B 49/00* (2013.01); *F25B 2600/07* (2013.01)

(58) Field of Classification Search
CPC ..... A61B 5/082; A61B 5/6889; A61B 5/4845; A61B 5/145; A61B 2560/0252; G01N 33/0047; G01N 33/4972; F24F 11/52; F24F 11/50; F24F 11/30; F24F 11/64; F24F 2110/66; F24F 2110/50; F24F 2120/12; F24F 2110/10; F24F 2110/65; Y02B 30/70; H05K 7/20736; F25B 49/00; F25B 2600/07

See application file for complete search history.

(56) References Cited

U.S. PATENT DOCUMENTS

| | | |
|---|---|---|
| 8,521,332 B2 | 8/2013 | Tiemann et al. |
| 9,746,199 B1 | 8/2017 | Drees et al. |
| 10,359,208 B2 | 7/2019 | Drees et al. |

(Continued)

FOREIGN PATENT DOCUMENTS

CN     112923600 A   *   6/2021

OTHER PUBLICATIONS

R. T. Ugale and K. B. Chavhan, "Web-based automated electric machine test-bench with data acquisition and remote control," 2016 IEEE International Conference on Power Electronics, Drives and Energy Systems (PEDES), Trivandrum, 2016, pp. 1-5. (Dec. 14-17, 2016).*

(Continued)

*Primary Examiner* — Said Bouziane
(74) *Attorney, Agent, or Firm* — Foley & Lardner LLP

(57)     ABSTRACT

An actuator includes a motor, a drive member coupled to the motor and structured to transfer movement from the motor to an external mechanism, and a control chip configured to host a web server, connect with a wireless communication network and provide access to the web server via the wireless communication network, and control the motor using reprogrammable control logic. The reprogrammable control logic is adjustable by a user via the web server and the wireless communication network.

20 Claims, 21 Drawing Sheets

(56) References Cited

U.S. PATENT DOCUMENTS

| | | | |
|---|---|---|---|
| 2002/0029575 A1* | 3/2002 | Okamoto | H04L 12/2803 |
| | | | 236/94 |
| 2017/0293293 A1 | 10/2017 | Brownie et al. | |
| 2018/0238577 A1 | 8/2018 | Drees et al. | |
| 2018/0239371 A1 | 8/2018 | Drees et al. | |
| 2018/0314277 A1 | 11/2018 | Moore et al. | |
| 2019/0331357 A1* | 10/2019 | Rogerson | C09D 5/14 |
| 2019/0338980 A1 | 11/2019 | Drees et al. | |
| 2020/0396297 A1 | 12/2020 | Brophy et al. | |
| 2021/0341165 A1 | 11/2021 | Pierson et al. | |

OTHER PUBLICATIONS

European Search Report for EP Appl. Ser. No. EP22213452 dated Apr. 17, 2023 (10 pages).

Gunputh et al., "Design and implementation of a low-cost Arduino-based smart home system," 2017 9th IEEE International Conference on Communication Software and Networks, May 6, 2017 (pp. 1491-1495).

EP Office Action for Appl. Ser. No. EP 22213452 dated Feb. 13, 2025 (10 pages).

EP Office Action for Appl. Ser. No. EP 22213452 dated Jun. 23, 2025 (8 pages).

EP Office Action for EP Appl. Ser. No. 22213452 dated Sep. 2, 2024 (9 pages).

EP Office Action for EP Appl. Ser. No. 22213452.0 dated Feb. 16, 2024 (8 pages).

EP Office Action for Appl. Ser. No. EP 22213452.0 dated Oct. 7, 2025 (8 pages).

* cited by examiner

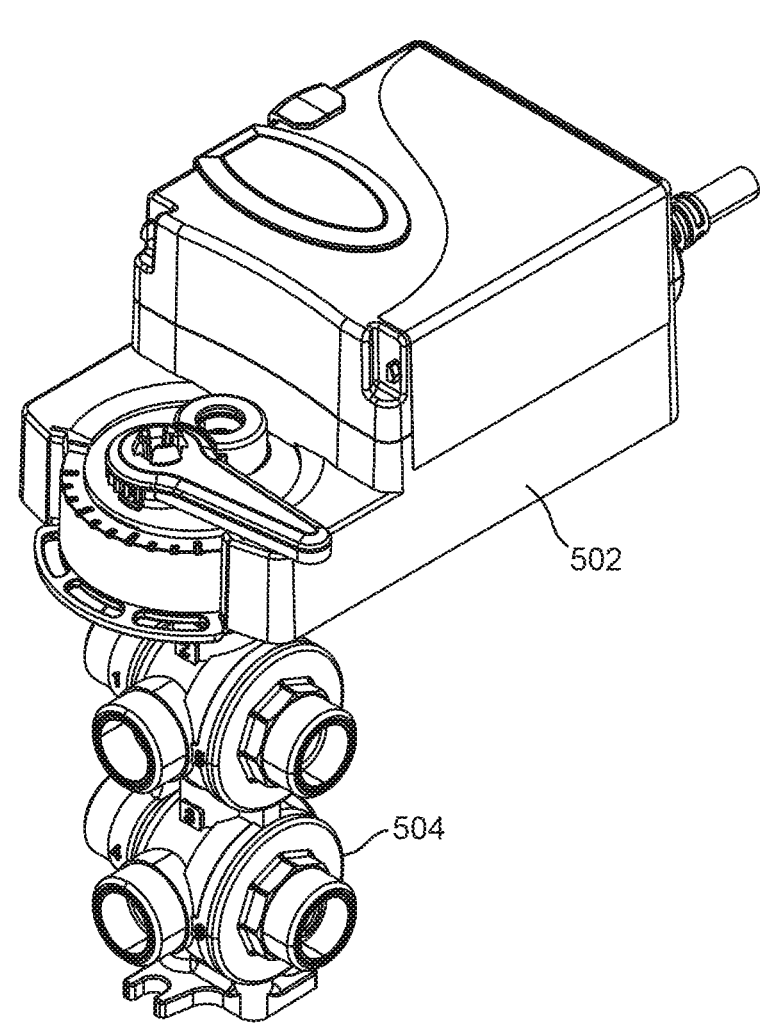
FIG. 5

1200

1208

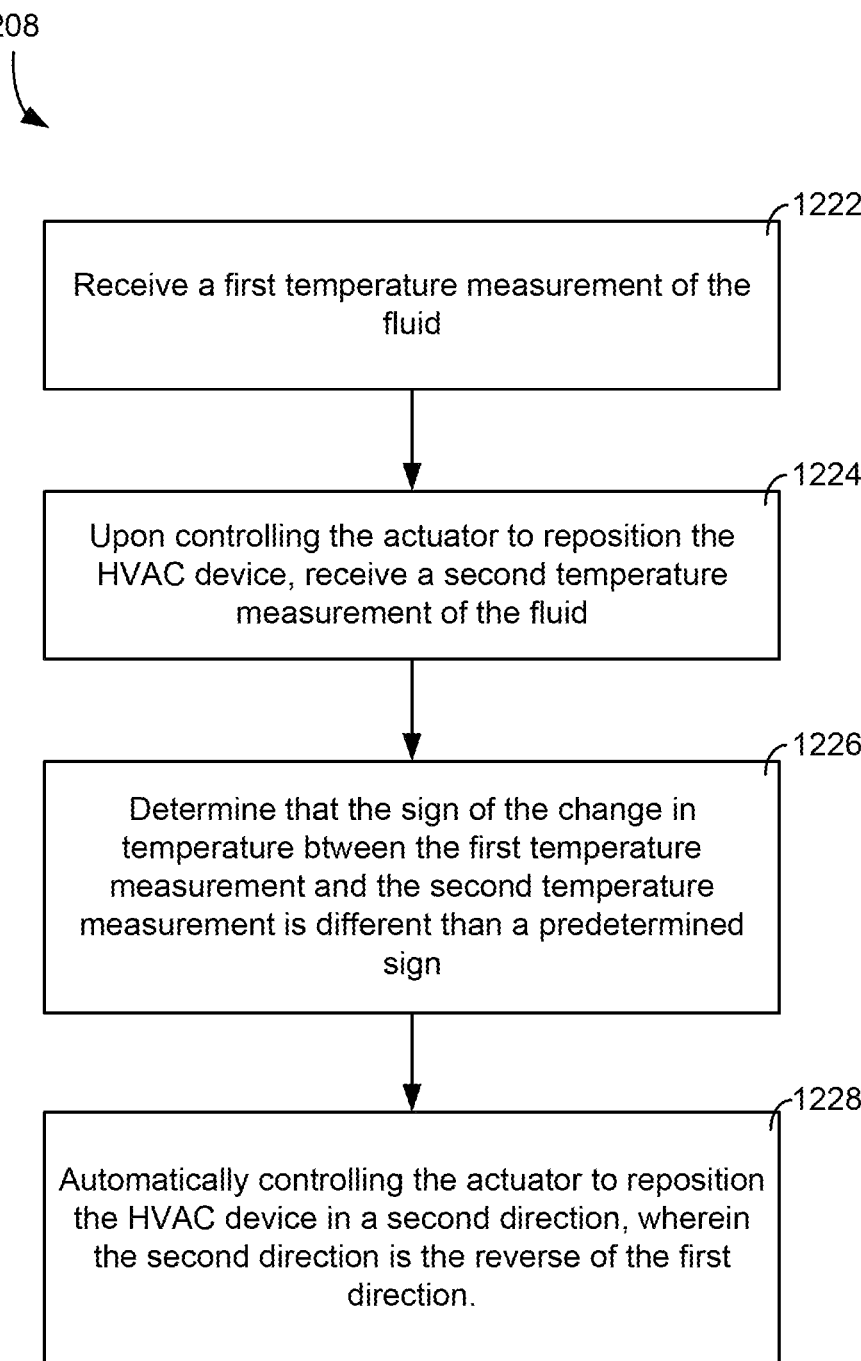

1222

Receive a first temperature measurement of the fluid

1224

Upon controlling the actuator to reposition the HVAC device, receive a second temperature measurement of the fluid

1226

Determine that the sign of the change in temperature btween the first temperature measurement and the second temperature measurement is different than a predetermined sign

1228

Automatically controlling the actuator to reposition the HVAC device in a second direction, wherein the second direction is the reverse of the first direction.

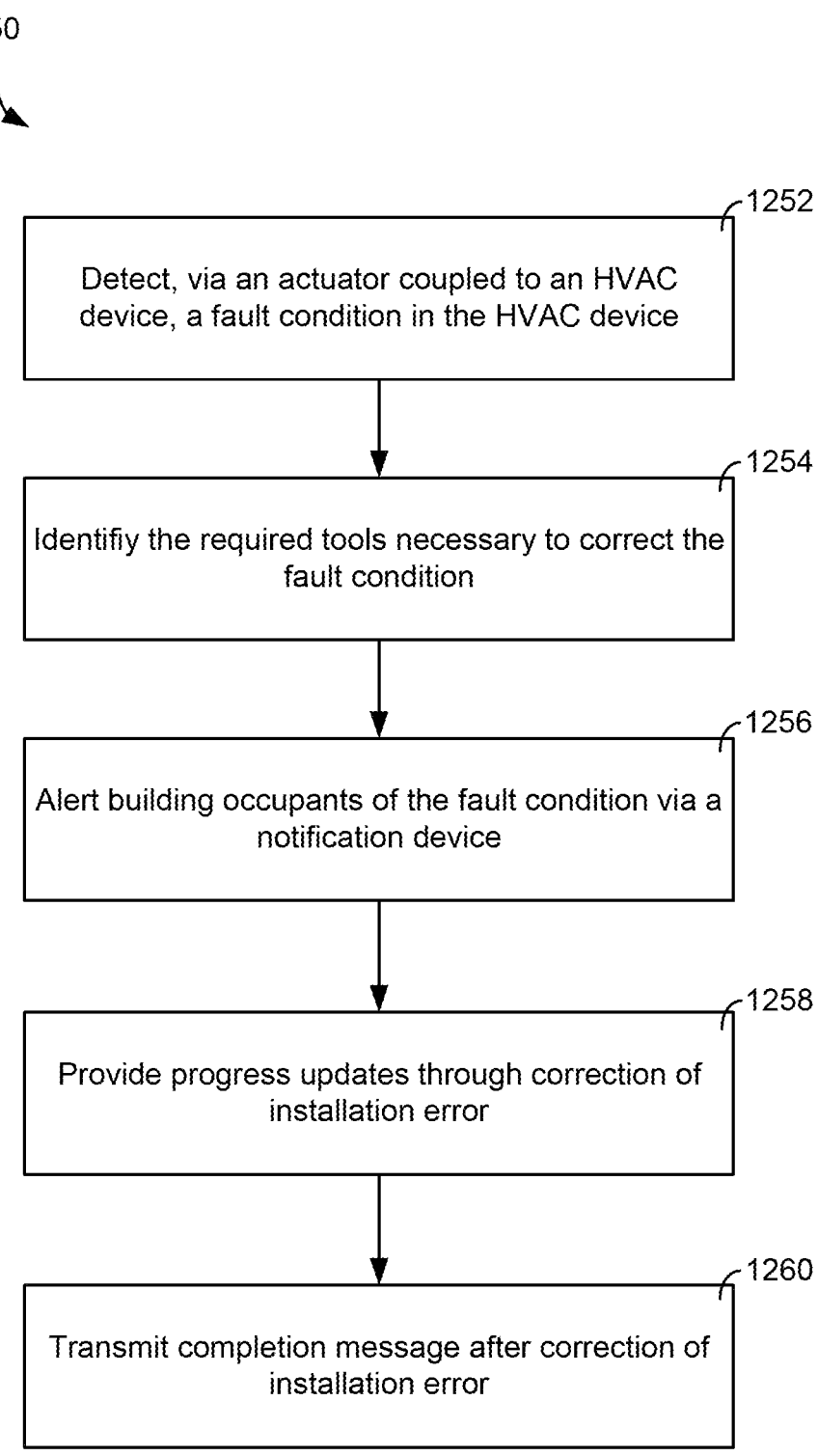

1252

Detect, via an actuator coupled to an HVAC device, a fault condition in the HVAC device

1254

Identifiy the required tools necessary to correct the fault condition

1256

Alert building occupants of the fault condition via a notification device

1258

Provide progress updates through correction of installation error

1260

Transmit completion message after correction of installation error

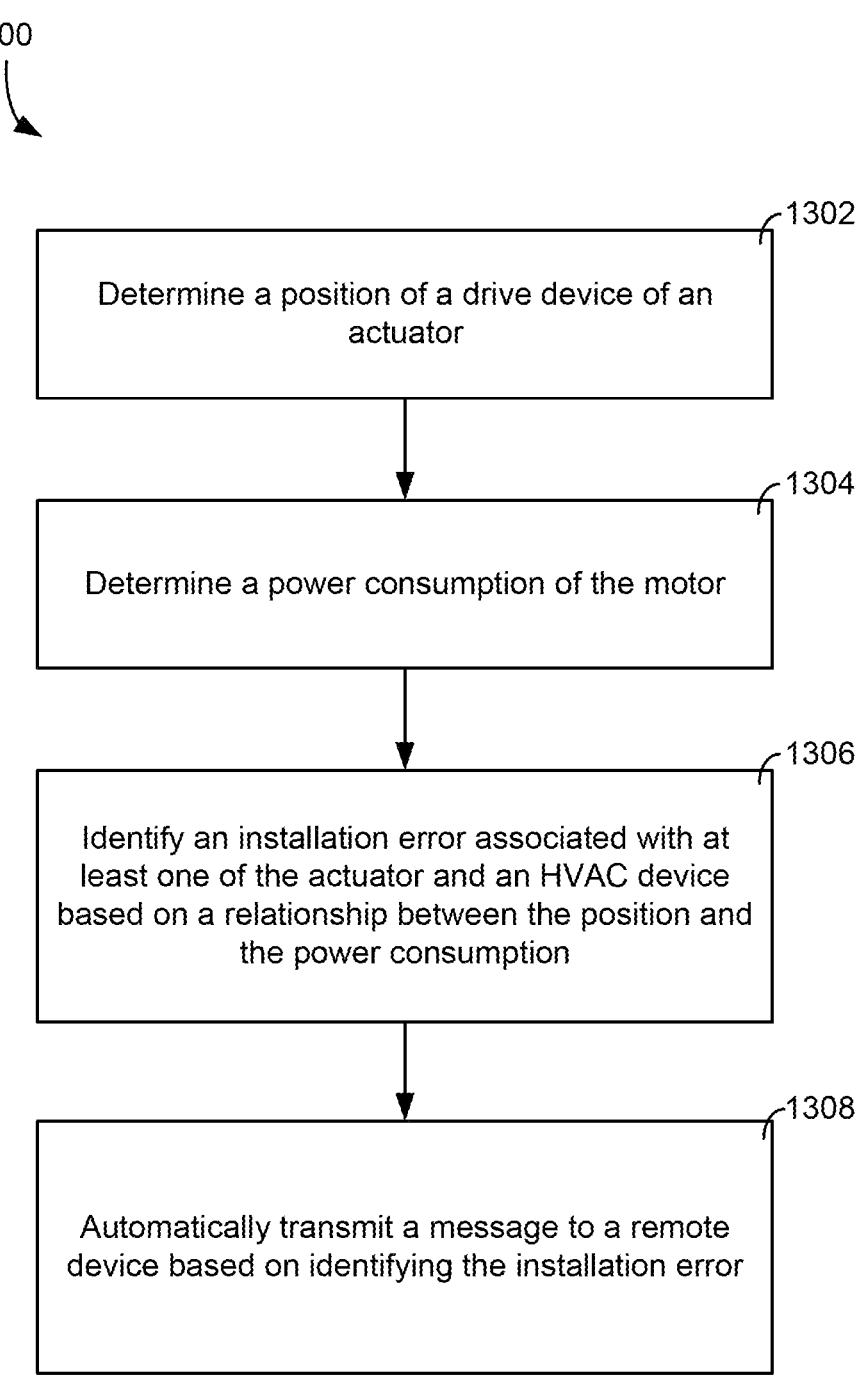

1302

Determine a position of a drive device of an actuator

1304

Determine a power consumption of the motor

1306

Identify an installation error associated with at least one of the actuator and an HVAC device based on a relationship between the position and the power consumption

1308

Automatically transmit a message to a remote device based on identifying the installation error

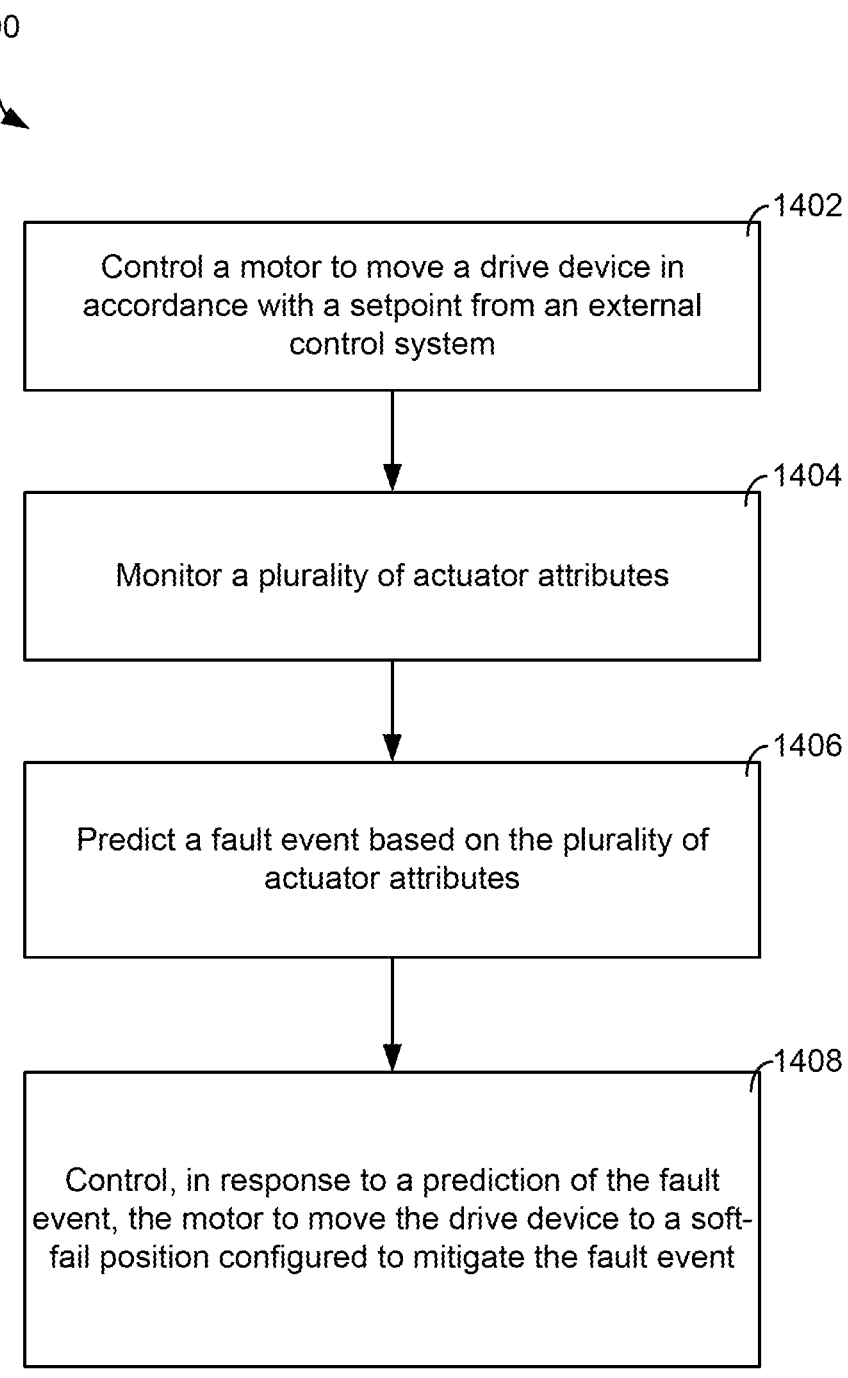

1402

Control a motor to move a drive device in accordance with a setpoint from an external control system

1404

Monitor a plurality of actuator attributes

1406

Predict a fault event based on the plurality of actuator attributes

1408

Control, in response to a prediction of the fault event, the motor to move the drive device to a soft-fail position configured to mitigate the fault event

FIG. 14

REPROGRAMMABLE SMART ACTUATOR OR REFRIGERATED CABINET WITH WEB SERVER

BACKGROUND

Actuators used in heating, ventilation, or air conditioning (HVAC) systems may monitor conditions of the actuator operation, but conventional actuators are unable to implement automatic corrective action after detecting fault conditions. Conventional actuator systems do not provide real-time updates of various processes and steps for detecting and correcting fault conditions to HVAC technicians. Installation errors or other faults may occur or be present in actuator applications. Also, actuator firmware may be difficult to develop and validate, causing actuator control logic to be fixed or inflexible. Additionally, it may be difficult to access or interpret data relating to actuators.

Refrigerated cabinets, including walk-in freezers, walk-in coolers, refrigerated display cases, refrigerators, etc. often have similar challenges. For example, controllers for refrigeration circuits of refrigerated cabinets may include firmware which is difficult to update and validate for new functionality. Additionally, it may be difficult to access or visualize data relating to the operation of refrigerated cabinets.

SUMMARY

One implementation for the present disclosure is an actuator comprising a motor, a drive member coupled to the motor and structured to transfer movement from the motor to an external mechanism, and a control chip coupled to the motor. The control chip is configured to host a web server, connect with a wireless communication network and provide access to the web server via the wireless communication network, and control the motor using reprogrammable control logic, wherein the reprogrammable control logic is adjustable by a user via the web server and the wireless communication network.

In some embodiments, the web server is configured to provide a dashboard showing visualizations relating to operation of the actuator. The web server may provide an option to change a setpoint for the reprogrammable control logic. The actuator may include a housing containing the motor and the control chip (and the web server of the control chip).

In some embodiments, the control chip includes comprises an input pin configured to receive a signal from a sensor. The reprogrammable control logic may cause the control chip to control the motor as a function of the signal from the sensor.

Another implementation of the present disclosure is a system including a personal computing device and an actuator. The actuator includes a motor, a drive member coupled to the motor and structured to transfer movement from the motor to an external mechanism, and a control chip coupled to the motor. The control chip is configured to host a web server, provide the personal computing device with direct access to the web server via a wireless communication network, and control the motor using reprogrammable control logic. The reprogrammable control logic is reprogrammable via the personal computing device and the web server.

In some embodiments, the system also includes a supervisory controller of a building management system. The supervisory controller is communicable with the control chip via the wireless communication network and is configured to provide a parameter used by the reprogrammable control logic. In some embodiments, the system also includes a cloud-based computing resource, and the supervisory controller and the personal computing device are communicable with the cloud-based computing resource.

In some embodiments, the system also includes a fan and the control chip is configured to control a speed of the fan. In some embodiments, the actuator also includes a housing containing the motor and the control chip. In some embodiments, the personal computing device stores a plurality of selectable control modules and allows a user to reprogram the control chip by selecting a subset of the selectable control modules for the control chip to execute.

Another implementation of the present disclosure is a refrigerated cabinet. The refrigerated cabinet includes a refrigeration circuit, a thermostat coupled to the refrigeration circuit and including a control chip. The control chip is configured to host a web server, connect with a wireless communication network and provide access to the web server via the wireless communication network, control operation of the refrigeration circuit using reprogrammable control logic, and output information relating to the operation of the refrigeration circuit via the web server.

In some embodiments, the web server is configured to provide the information as a dashboard. In some embodiments, the reprogrammable control logic is reprogrammable via the wireless communication network. The reprogrammable control logic may be reprogrammable by activating a subset of a plurality of selectable control modules and deselecting a remainder of the selectable control modules. The plurality of selectable control modules define a plurality of different control logic including temperature feedback control logic, temperature alarm logic, defrost logic, and fault detection logic.

In some embodiments, the refrigerated cabinet includes a case defining a volume cooled by the refrigeration circuit. The thermostat may be positioned in the case. The case may be a refrigerated display case. The case may define walls of a walk-in freezer. The control chip may be configured to operate at temperatures at least as low as −40 C.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 1 is a perspective view drawing of a valve and actuator assembly, according to some embodiments.

FIG. 5 is a perspective view drawing of a six-way valve assembly that can be implemented in the valve and actuator assembly of FIG. 1, according to some embodiments.

FIGS. 12A-C are processes of detecting and correcting faults within an HVAC system, which can be used in the actuator system of FIG. 11A, according to some embodiments.

FIG. 13 is a process of detecting and correcting faults within an HVAC system, which can be used in the actuator system of FIG. 11A, according to some embodiments.

FIG. 14 is a process for entering a soft-fail state, which can be implemented by the actuator of FIG. 11B, according to some embodiments.

DETAILED DESCRIPTION

Figure 1:
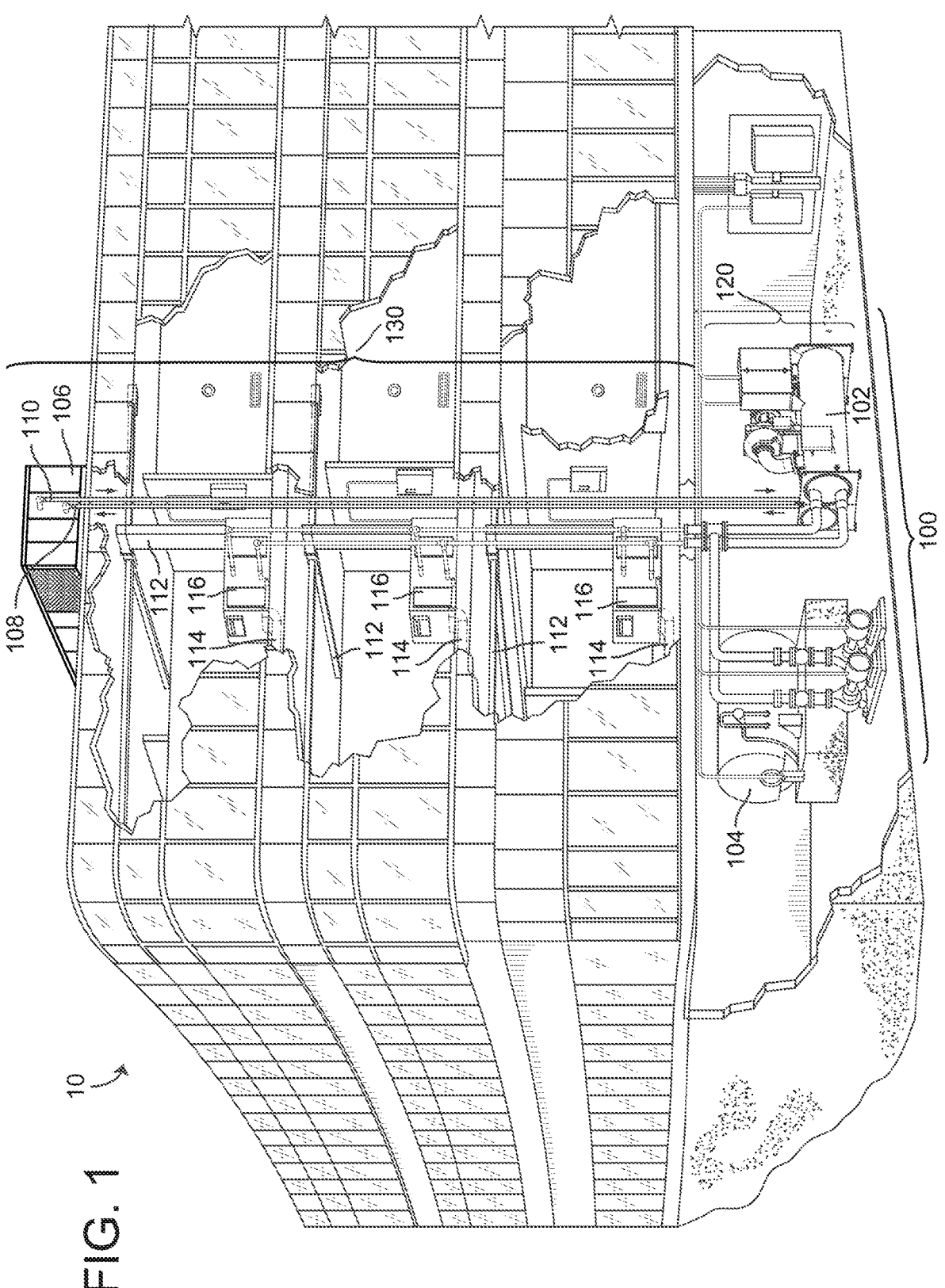
FIG. 1 is a drawing of a building equipped with a heating, ventilation, or air conditioning (HVAC) system, according to an exemplary embodiment.

Referring generally to the FIGURES, some FIGURES show an HVAC valve/actuator with fault detection and resolution, according to some embodiments. The actuator systems and methods disclosed herein detect installation errors (e.g., faults, fault conditions, etc.) and engage in corrective action through various control schemas (e.g., providing various control signals). These may include detecting backwards installation of a valve or actuator through automated testing and automatically reversing control polarity to correct for backwards installation.

In other embodiments, the systems and methods disclosed herein detect installation errors and transmit maintenance data to various user devices (e.g., smartphones, tablets, building operator computers, etc.). The various tools required to correct the fault condition may also be transmitted to user devices, for example directly via a wireless interface of the actuator and by a web server hosted by the actuator itself.

The FIGURES show examples where the actuator (or a refrigerated cabinet) provides a web server and a wireless interface that can allow a user to access a web page provided by the web server. In some cases, a user device (smartphone, tablet, etc.) can connect directly to the wireless interface over a wireless network provided by the wireless interface of the actuator in order to view a dashboard of data relating to the actuator and/or to provide inputs affecting control logic executed by the actuator to move a valve, damper, or other mechanism. The control logic may be modular and easily reprogrammable, for example by activating one or more control blocks from a set of available control blocks executable by a chip of the actuator. Such features can also be implemented on a controller for a refrigerated cabinet, as shown in the FIGURES and described in detail below.

The valves described herein may be used to regulate fluid flow from multiple fluid supplies and/or to multiple fluid returns. In some embodiments, the valve is a three-way valve having a valve body and a valve member. In other embodiments, the valve is a six-way valve having a valve body and a valve member. The valve body may include a valve chamber and a plurality of ports in fluid communication with the valve chamber (e.g., a first port, a second port, a third port). The valve may be controlled (e.g., by an actuator and/or a controller) by rotating the valve member within the valve chamber.

Ball valves can be classified based on the number of connections formed by the valve (e.g., two-way valves, three-way valves), the shape of the passage through the spherical valve member (e.g., L-shaped, T-shaped, X-shaped), and the size of the passage through the valve member (e.g., full bore, reduced bore). Three-way ball valves are often used to switch between two separate fluid supplies and/or returns. Six-way ball valves, which combine two three-way valve bodies in a stacked orientation, may be used to switch between both two fluid supplies and two fluid returns. The six-way valve body may use two separate valve members (e.g., for independently switching fluid supplies and fluid returns) or a shared valve member (e.g. for switching fluid supplies and fluid returns in unison).

The actuator may be a damper actuator, a valve actuator, a fan actuator, a pump actuator, or any other type of actuator that can be used in a HVAC system. The actuator includes a motor and a drive device driven by the motor. In some embodiments, the motor is a brushless direct current (BLDC) motor. In some embodiments, the motor is a stepper motor. The drive device is coupled to a movable HVAC component for driving the movable HVAC component between multiple positions, for example through rotary movement or linear movement.

Building Management System and HVAC System

Referring now to FIG. 1, a perspective view of a building 10 is shown. Building 10 is served by a building management system (BMS). A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 may include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. In some embodiments, waterside system 120 is replaced with a central energy plant such as central plant 200, described with reference to FIG. 2.

Still referring to FIG. 1, HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of water-side system 120 may be located in or around building 10 (as shown in FIG. 1) or at an offsite location such as a central plant (e.g., a chiller plant, a steam plant, a heat plant, etc.). The working fluid may be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 may be transported to AHU 106 via piping 108.

AHU 106 may place the working fluid in a heat exchange relationship with an airflow passing through AHU 106 (e.g., via one or more stages of cooling coils and/or heating coils). The airflow may be, for example, outside air, return air from within building 10, or a combination of both. AHU 106 may transfer heat between the airflow and the working fluid to provide heating or cooling for the airflow. For example, AHU 106 may include one or more fans or blowers config-ured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodi-ments, airside system 130 includes multiple variable air volume (VAV) units 116. For example, airside system 130 is shown to include a separate VAV unit 116 on each floor or zone of building 10. VAV units 116 may include dampers or other flow control elements that can be operated to control an amount of the supply airflow provided to individual zones of building 10. In other embodiments, airside system 130 delivers the supply airflow into one or more zones of building 10 (e.g., via air supply ducts 112) without using intermediate VAV units 116 or other flow control elements. AHU 106 may include various sensors (e.g., temperature sensors, pressure sensors, etc.) configured to measure attri-butes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Figure 2:
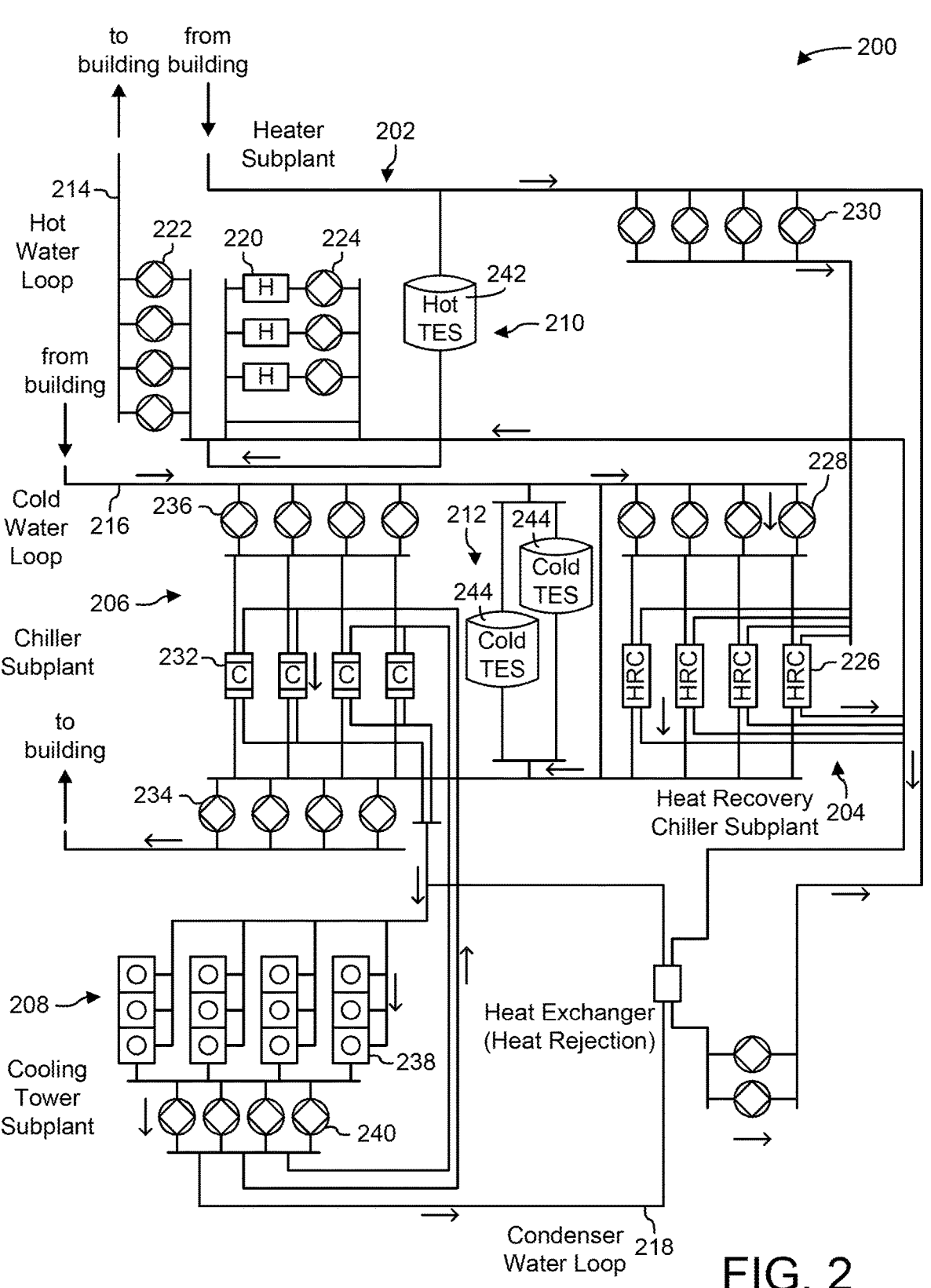
FIG. 2 is a schematic of a waterside system which can be used as part of the HVAC system of FIG. 1, according to some embodiments.

Referring now to FIG. 2, a block diagram of a central plant 200 is shown, according to an exemplary embodiment. In brief overview, central plant 200 may include various types of equipment configured to serve the thermal energy loads of a building or campus (i.e., a system of buildings). For example, central plant 200 may include heaters, chillers, heat recovery chillers, cooling towers, or other types of equipment configured to serve the heating and/or cooling loads of a building or campus. Central plant 200 may consume resources from a utility (e.g., electricity, water, natural gas, etc.) to heat or cool a working fluid that is circulated to one or more buildings or stored for later use (e.g., in thermal energy storage tanks) to provide heating or cooling for the buildings. In various embodiments, central plant 200 may supplement or replace waterside system 120 in building 10 or may be implemented separate from build-ing 10 (e.g., at an offsite location).

Central plant 200 is shown to include a plurality of subplants 202-212 including a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources from utilities to serve the thermal energy loads (e.g., hot water, cold water, heating, cooling, etc.) of a building or campus. For example, heater subplant 202 may be config-ured to heat water in a hot water loop 214 that circulates the hot water between heater subplant 202 and building 10. Chiller subplant 206 may be configured to chill water in a cold water loop 216 that circulates the cold water between chiller subplant 206 and building 10. Heat recovery chiller subplant 204 may be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air may be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, $CO_2$, etc.) may be used in place of or in addition to water to serve the thermal energy loads. In other embodiments, subplants 202-212 may provide heating and/or cooling directly to the building or campus without requiring an intermediate heat transfer fluid. These and other variations to central plant 200 are within the teachings of the present invention.

Each of subplants 202-212 may include a variety of equipment configured to facilitate the functions of the sub-plant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in central plant 200 (e.g., pumps 222, 224, 228, 230, 234, 236, and/or 240) or pipelines in central plant 200 include an isolation valve associated therewith. Isolation valves may be integrated with the pumps or positioned upstream or downstream of the pumps to control the fluid flows in central plant 200. In various embodiments, central plant 200 may include more, fewer, or different types of devices and/or subplants based on the particular configuration of central plant 200 and the types of loads served by central plant 200.

Figure 3:
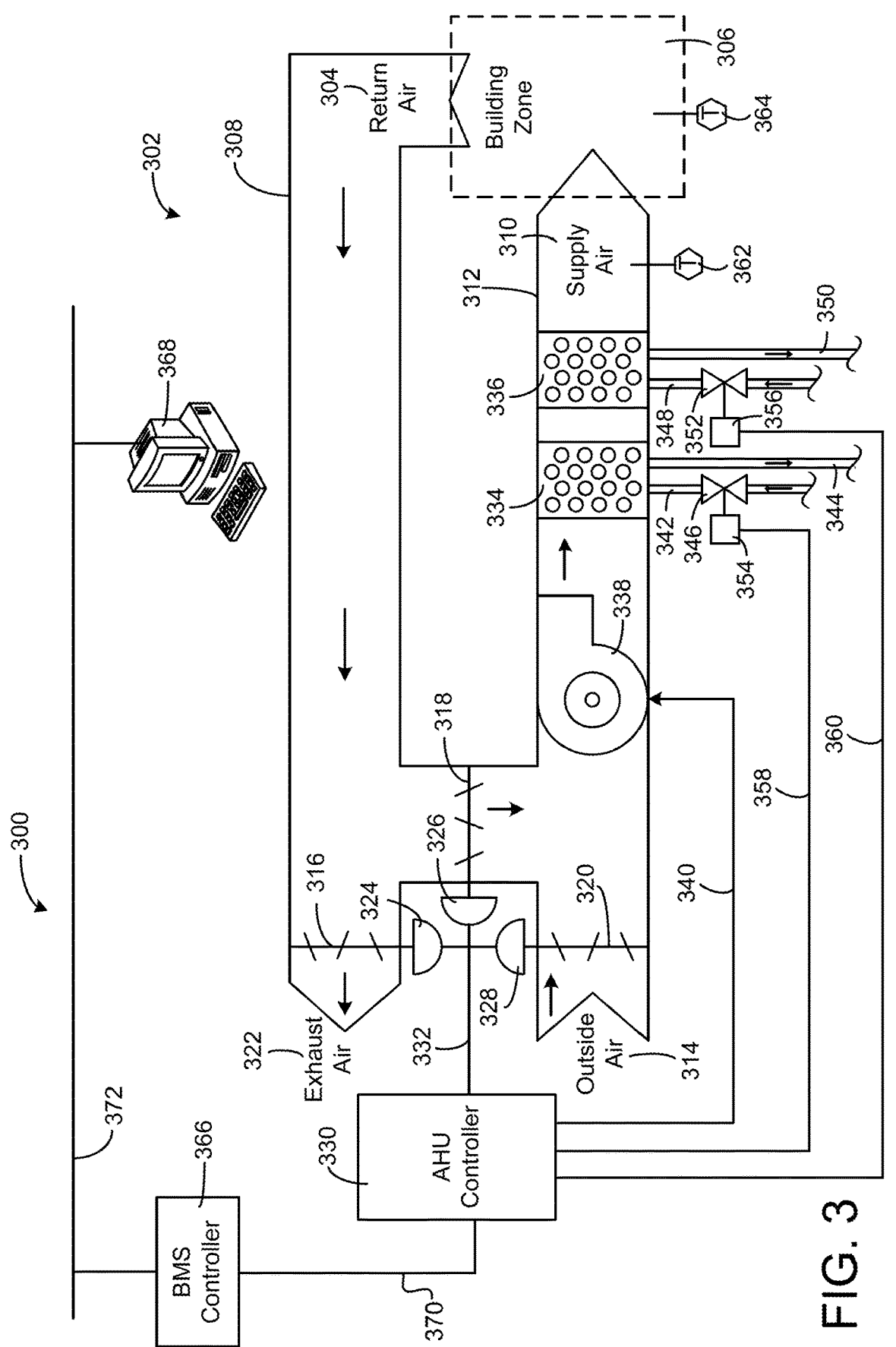
FIG. 3 is a block diagram of an airside system which can be used as part of the HVAC system of FIG. 1, according to some embodiments.

Referring now to FIG. 3, a block diagram of an airside system 300 is shown, according to an example embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, duct 112, duct 114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360. Actuators 354-356 can receive control signals from AHU controller 330 and can provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and

352 affect the amount of heating or cooling provided to supply air 310 by cooling coil 334 or heating coil 336 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 can provide BMS controller 366 with temperature measurements from temperature sensors 362 and 364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Figure 4:
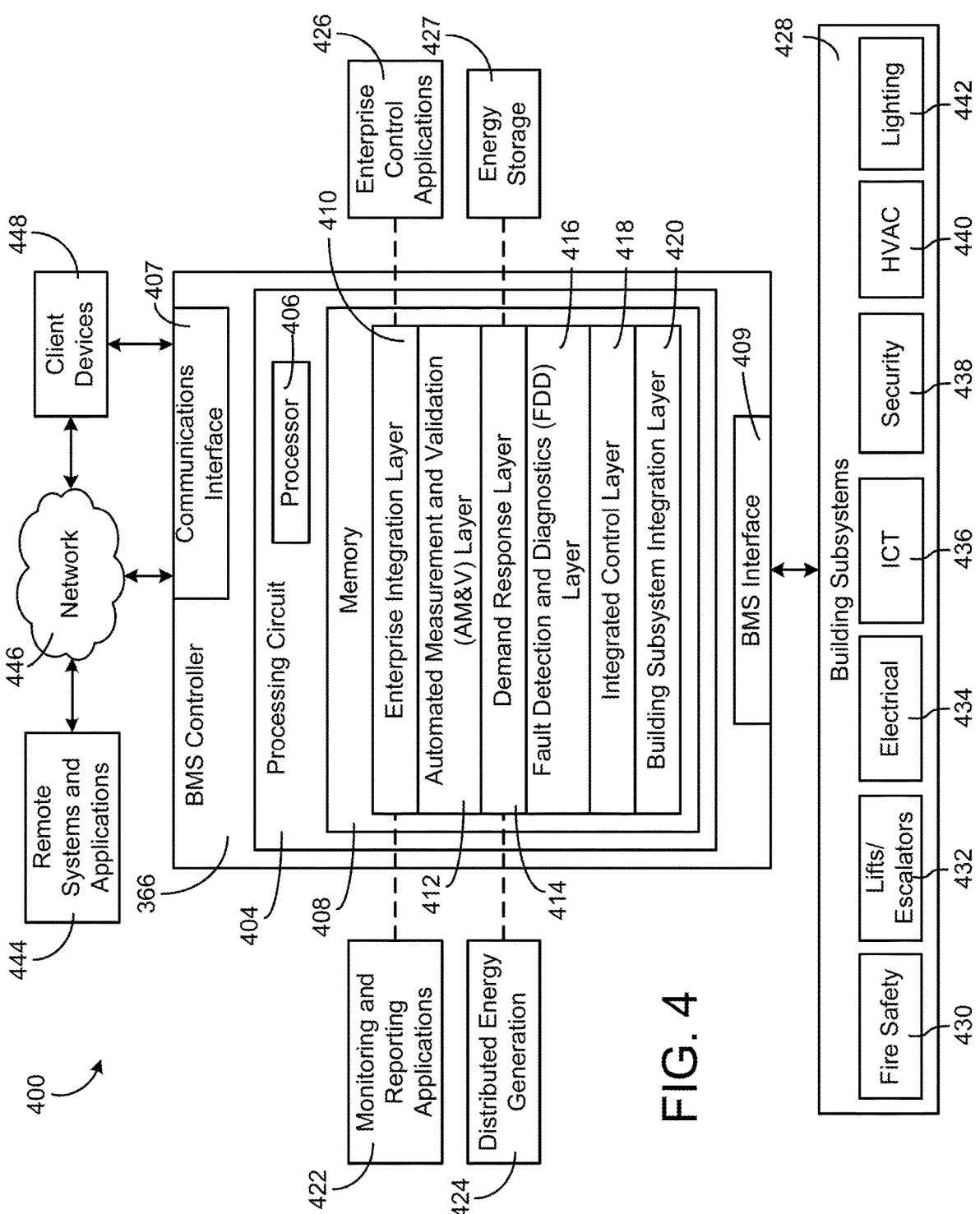
FIG. 4 is a block diagram of a building management system (BMS) which can be used

Referring now to FIG. 4, a block diagram of a building management system (BMS) 400 is shown, according to an example embodiment. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 can also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2 and 3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices (e.g., card access, etc.) and servers, or other security-related devices.

Still referring to FIG. 4, BMS controller 366 is shown to include a communications interface 407 and a BMS interface 409. Communications interface 407 can facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Communications interface 407 can also facilitate communications between BMS controller 366 and client devices 448. BMS interface 409 can facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to an example embodiment, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration layer 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 can also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at communications interface 407 and/or BMS interface 409.

Building subsystem integration layer 420 can be configured to manage communications between BMS controller 366 and building subsystems 428. For example, building subsystem integration layer 420 can receive sensor data and input signals from building subsystems 428 and provide output data and control signals to building subsystems 428. Building subsystem integration layer 420 can also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 can receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs can also include inputs such as electrical use (e.g., expressed in kWh), thermal load measurements, pricing information, projected pricing, smoothed pricing, curtailment signals from utilities, and the like.

According to an example embodiment, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 can also include control logic configured to determine when to utilize stored energy. For example, demand response layer 414 can determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models can represent collections of building equipment (e.g., subplants, chiller arrays, etc.) or individual devices (e.g., individual chillers, heaters, pumps, etc.).

Demand response layer 414 can further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In an example embodiment, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints can also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 can compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 can receive data inputs from integrated control layer 418, directly from one or more building subsystems or devices, or from another data source. FDD layer 416 can automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other example embodiments, FDD layer 416 is configured to provide "fault" events to integrated control layer 418 which executes control strategies and policies in response to the received fault events. According to an example embodiment, FDD layer 416 (or a policy executed by an integrated control engine or business rules engine) can shut-down systems or direct control activities around faulty devices or systems to reduce energy waste, extend equipment life, or assure proper control response.

FDD layer 416 can be configured to store or access a variety of different system data stores (or data points for live data). FDD layer 416 can use some content of the data stores to identify faults at the equipment level (e.g., specific chiller, specific AHU, specific terminal unit, etc.) and other content to identify faults at component or subsystem levels. For example, building subsystems 428 can generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Referring now to FIG. 5, a view of an actuator and valve assembly 500 is shown, according to some embodiments. Assembly 500 may be used in an HVAC system, a waterside system, an airside system, or a building management system (BMS). Assembly 500 is shown to include an actuator 502 coupled to a six-way valve assembly 504. Actuator 502 may be configured to actuate a valve member of the six-way valve 504 and control fluid flow through the valve body to regulate a flow of fluid through a conduit, pipe, or tube.

Figure 6:
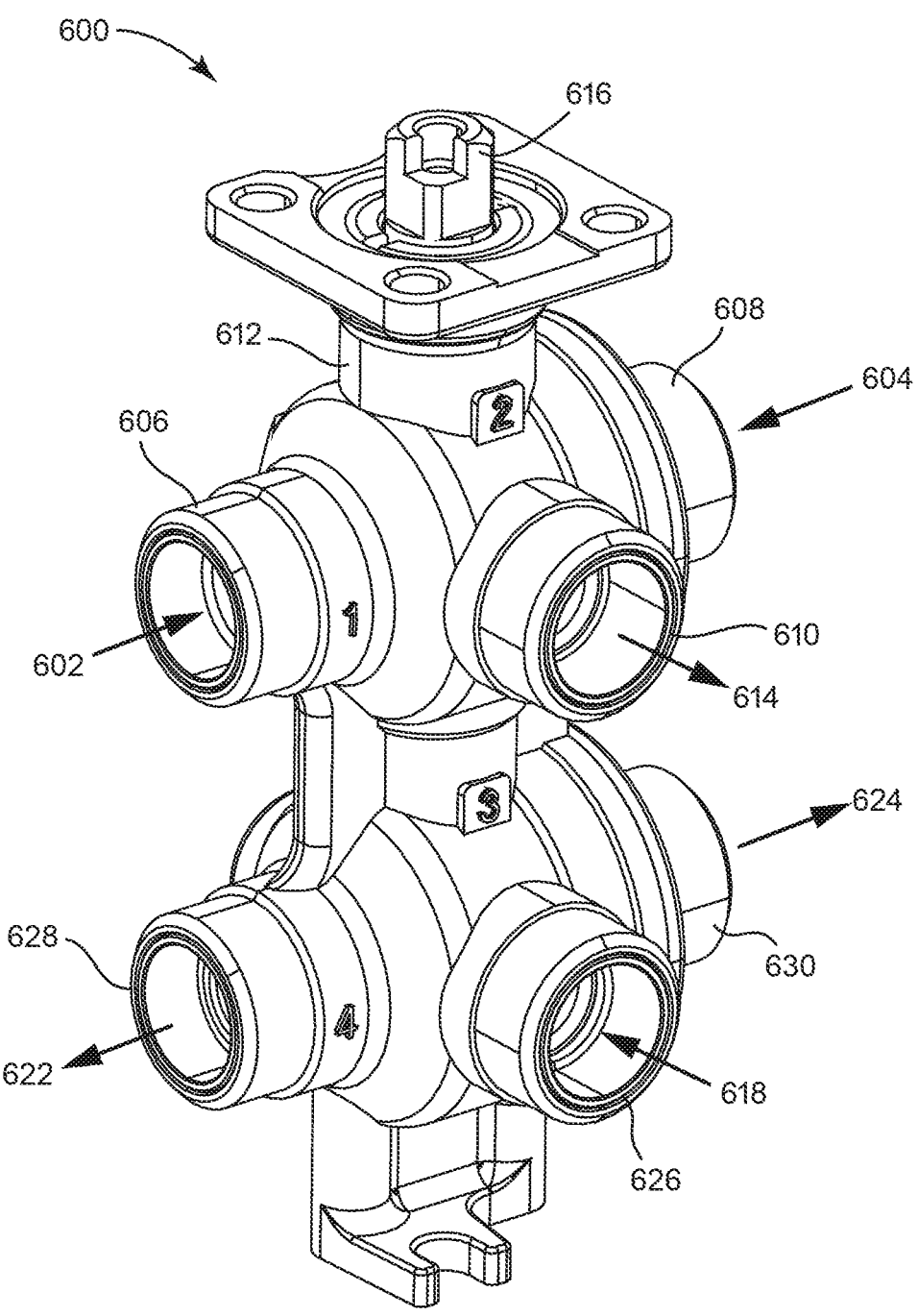
FIG. 6 is a perspective view drawing of a six-way valve that can be implemented in the valve and actuator assembly of FIG. 1, according to some embodiments.

Referring now to FIG. 6, a six-way valve assembly 600 is shown according to an exemplary embodiment. In some embodiments, valve assembly 600 is identical or substantially similar to valve assembly 504 depicted in FIG. 1. Six-way valve assembly 600 is shown to include a six-way valve body 612 and a valve member 616. Six-way valve body 612 may combine two three-way valve bodies in a stacked orientation. In the stacked orientation, a single valve member 616 can be used to control fluid flow through both of the three-way valve bodies. Advantageously, six-way valve assembly 600 may be controlled by a single actuator (e.g., actuator 502) acting upon valve member 616.

Six-way valve assembly 600 may be used to switch between two fluid supplies and two fluid returns. For example, six-way valve assembly 600 may be configured to receive first fluid supply 602 at first supply port 606 and to receive second fluid supply 604 at second supply port 608. As shown, first port 606 and second port 608 may be inline ports (e.g., aligned with a common axis) and may be located on opposites sides of the valve chamber. Valve member 616 may be rotated to selectively control fluid flow from either first supply port 606 or second supply port 608 to outlet port 610 (e.g., without mixing).

Outlet port 610 may be a transverse port (e.g., not in line with ports 606 and 608). As shown, outlet port 610 is substantially perpendicular to ports 606 and 608 and in the same plane as ports 606 and 608. In other embodiments, outlet port 610 may be oriented at a variety of different angles relative to ports 606 and 608 and may not be in the same plane as ports 606 and 608. Outlet port 610 may connect to a fan coil unit (e.g., via a coil supply line). The fluid from outlet port 610 may pass through a fan coil unit and return to valve assembly 600 at return port 626. Valve member 616 may be rotated to selectively divert fluid from return port 626 to either first return port 628 or second return port 630. Return ports 628 and 630 may be fluidly connected to returns 622 and 624, respectively.

In various embodiments, the plurality of ports 606-630 may include any number of ports (e.g., two ports, three ports, four ports, six ports, twenty ports). Ports 606-630 may be configured to connect to pipes, tubes, or other fluid control components. Ports 606-630 may be configured to connect with fluid pipelines using threadings, compression fittings, glue, cement, flanges, welding, or other fasteners.

Valve body 612 may be made from any of a variety of materials including, for example, metals (e.g., cast iron, brass, bronze, steel, stainless steel, aluminum), plastics (e.g., PVC, PP, HDPE), glass-reinforced polymers (e.g., fiberglass), ceramics, or any combination thereof. The material or materials used to form valve body 612 may be based on the application for which valve body 612 is intended. For example, corrosion-resistant materials may be used for implementations in which valve body 612 is used with corrosive fluids (e.g., salt water, acidic fluids).

Still referring to FIG. 6, valve assembly 600 is shown to include valve member 616. Valve member 616 may include one or more ball members and a valve stem. The ball members may be substantially spherical. In various embodiments, the ball member may be fixedly attached to the valve stem or combined with the valve stem into a single component. The valve stem may extend through valve body 612 and connect to a handle or actuator for controlling the rotation of the valve member 616.

In operation, valve member 616 may be located at least partially within the internal valve chamber. Valve member 616 may be controllably movable (e.g., in rotation, in linear movement) relative to valve body 612 to modulate fluid flow through valve 600. By rotating valve member 616 relative to valve body 612, fluid flow can be selectively controlled (e.g., diverted, adjusted, increased, decreased) between the plurality of ports 606-630.

Each ball member may include a passage that permits fluid to flow through the ball member. In some embodiments, the passage is L-shaped (e.g., having two openings and a single ninety degree bend). The passage may be formed by drilling two bores into the ball member at approximately 90 degrees relative to each other. The bores may connect to form the passage through the ball member. Conventional ball valves may have bores with a substantially circular-shaped shaped cross section. In other embodiments, the passage may be T-shaped (e.g., having a main bore straight through the ball member and a second bore extending perpendicularly from one side of the main bore), X-shaped (e.g., having two bores extending through the ball member and intersecting as a ninety degree angle) or having any other shape.

The passage through the ball member may be controllably aligned (e.g., partially aligned, fully aligned) with ports 606-630 to form a fluid connection between pairs of ports. For example, the passage may be rotated into alignment with either first port 606 and third port 610, or second port 608 and third port 610. Under the six-way valve configuration of valve 600, the passage may additionally be rotated into alignment with either return port 626 and first return port 628, or return port 626 and second return port 630.

Figure 7:
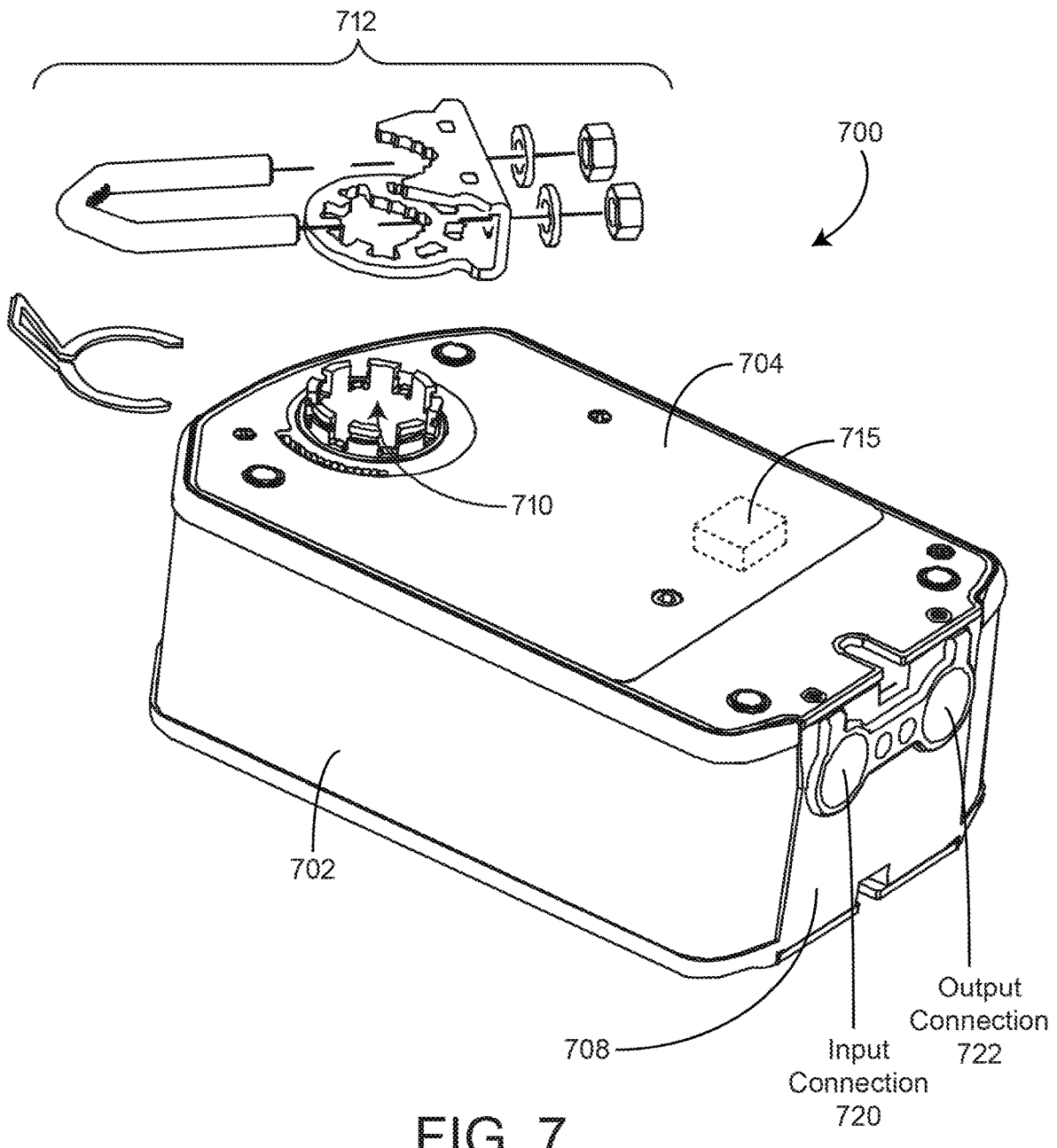
FIG. 7 is a perspective view drawing of an actuator that can be implemented in the valve and actuator assembly of FIG. 1, according to some embodiments.
Figures 8, 9:
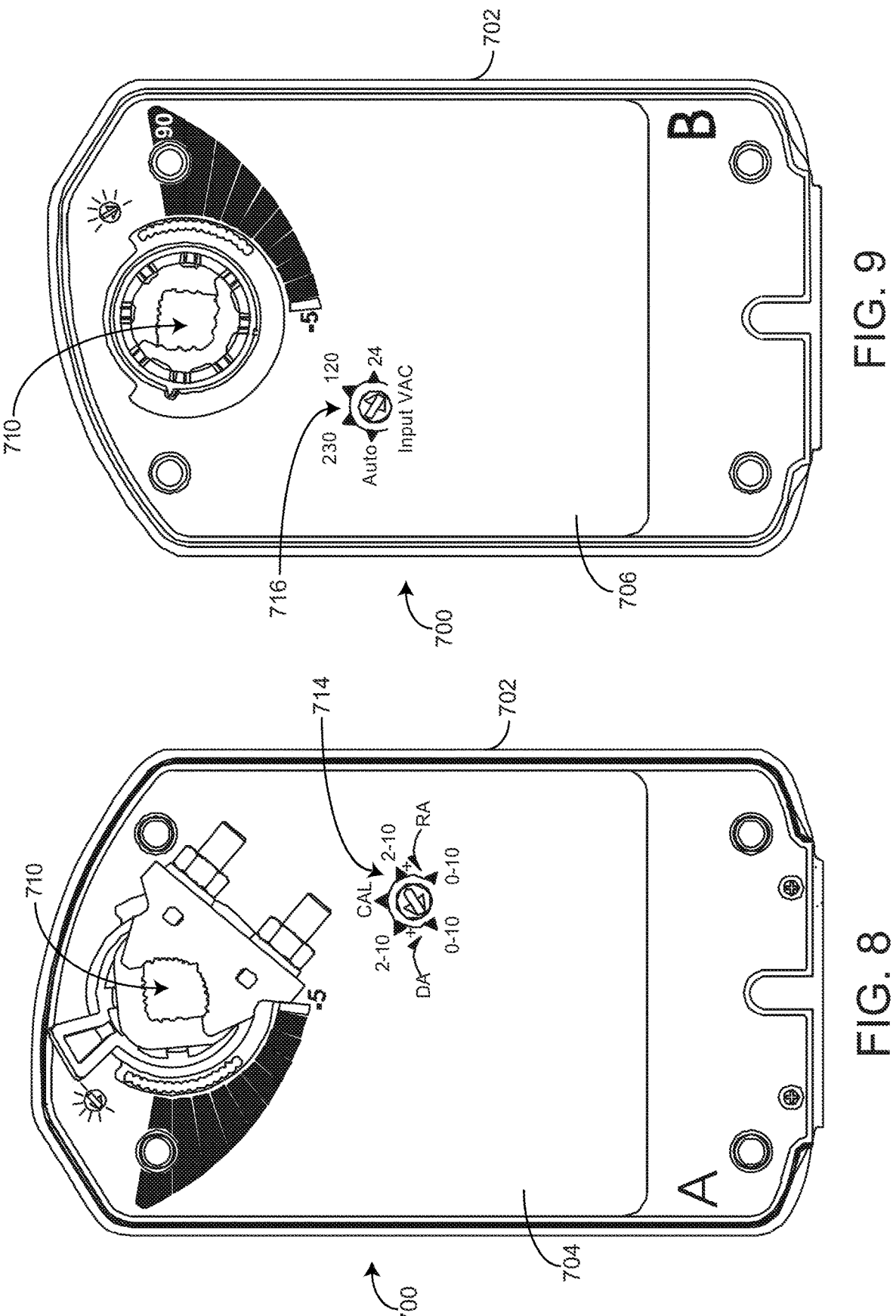
FIG. 8 is a top view drawing of the actuator of FIG. 3, according to some embodiments.
FIG. 9 is a bottom view drawing of the actuator of FIG. 3, according to some embodiments.

Referring now to FIGS. 7-9, an actuator 700 for use in a HVAC system is shown, according to an exemplary embodiment. For example, actuator 700 may be a damper actuator, a valve actuator, a fan actuator, a pump actuator, or any other type of actuator that can be used in a HVAC system or BMS (e.g., BMS 400). In various embodiments, actuator 700 may be a linear actuator (e.g., a linear proportional actuator), a non-linear actuator, a spring return actuator, or a non-spring return actuator.

Actuator 700 is shown to include a housing 702 having a front side 704 (i.e., side A), a rear side 706 (i.e., side B) opposite front side 704, and a bottom 708. Housing 702 may contain the mechanical and processing components of actuator 700. In some embodiments, housing 702 contains a brushless direct current (BLDC) motor and a processing circuit configured to provide a pulse width modulated (PWM) DC output to control the speed of the BLDC motor. The processing circuit may be configured to compare a representation of the electric current output to the BLDC motor to a threshold and may hold the PWM DC output in an off state when the current exceeds the threshold. The processing circuit may also be configured to set the PWM DC output to zero and then ramp up the PWM DC output when actuator 700 approaches an end stop.

Actuator 700 is shown to include a drive device 710. Drive device 710 may be a drive mechanism, a hub, or other device configured to drive or effectuate movement of a HVAC system component. For example, drive device 710 may be configured to receive a shaft of a damper, a valve, or any other movable HVAC system component in order to drive (e.g., rotate) the shaft. In some embodiments, actuator 700 includes a coupling device 712 configured to aid in coupling drive device 710 to the movable HVAC system component. For example, coupling device 712 may facilitate attaching drive device 710 to a valve or damper shaft.

Actuator 700 is shown to include an input connection 720 and an output connection 722. In some embodiments, input connection 720 and output connection 722 are located along bottom 708. In other embodiments, input connection 720 and output connection 722 may be located along one or more other surfaces of housing 702. Input connection 720 may be configured to receive a control signal (e.g., a voltage input signal) from an external system or device. Actuator 700 may use the control signal to determine an appropriate PWM DC output for the BLDC motor. In some embodiments, the control signal is received from a controller such as an AHU controller, an economizer controller, a supervisory controller, a zone controller, a field controller, an enterprise level controller, a motor controller, an equipment-level controller (e.g., an actuator controller) or any other type of controller that can be used in a HVAC system or BMS.

In some embodiments, the control signal is a DC voltage signal. Actuator 700 may be a linear proportional actuator configured to control the position of drive device 710 according to the value of the DC voltage received at input connection 720. For example, a minimum input voltage (e.g., 0.0 VDC) may correspond to a minimum rotational position of drive device 710 (e.g., 0 degrees, −5 degrees), whereas a maximum input voltage (e.g., 10.0 VDC) may correspond to a maximum rotational position of drive device 710 (e.g., 90 degrees, 95 degrees). Input voltages between the minimum and maximum input voltages may cause actuator 700 to move drive device 710 into an intermediate position between the minimum rotational position and the maximum rotational position. In other embodiments, actuator 700 may be a non-linear actuator or may use different input voltage ranges or a different type of input signal (e.g., AC voltage or current) to control the position and/or rotational speed of drive device 710.

In some embodiments, the control signal is an AC voltage signal. Input connection 720 may be configured to receive an AC voltage signal having a standard power line voltage (e.g., 120 VAC or 630 VAC at 50/60 Hz). The frequency of the voltage signal may be modulated (e.g., by a controller for actuator 700) to adjust the rotational position and/or speed of drive device 710. In some embodiments, actuator 700 uses the voltage signal to power various components of actuator 700. Actuator 700 may use the AC voltage signal received via input connection 720 as a control signal, a source of electric power, or both. In some embodiments, the voltage signal is received at input connection 720 from a power supply line that provides actuator 700 with an AC voltage having a constant or substantially constant frequency (e.g., 120 VAC or 630 VAC at 50 Hz or 60 Hz). Input connection 720 may include one or more data connections (separate from the power supply line) through which actuator 700 receives control signals from a controller or another actuator (e.g., 0-10 VDC control signals).

In some embodiments, the control signal is received at input connection 720 from another actuator. For example, if multiple actuators are interconnected in a tandem arrangement, input connection 720 may be connected (e.g., via a communications bus) to the output data connection of another actuator. One of the actuators may be arranged as a master actuator with its input connection 720 connected to a controller, whereas the other actuators may be arranged as slave actuators with their respective input connections connected to the output connection 722 of the master actuator.

Output connection 722 may be configured to provide a feedback signal to a controller of the HVAC system or BMS in which actuator 700 is implemented (e.g., an AHU controller, an economizer controller, a supervisory controller, a zone controller, a field controller, an enterprise level controller). The feedback signal may indicate the rotational position and/or speed of actuator 700. In some embodiments, output connection 722 may be configured to provide a control signal to another actuator (e.g., a slave actuator) arranged in tandem with actuator 700. Input connection 720 and output connection 722 may be connected to the controller or the other actuator via a communications bus. The communications bus may be a wired or wireless communications link and may use any of a variety of disparate communications protocols (e.g., BACnet, LON, Wi-Fi, Bluetooth, NFC, TCP/IP).

Still referring to FIGS. 7-9, actuator 700 is shown to include a first user-operable switch 714 located along front side 704 (shown in FIG. 8) and a second user-operable switch 716 located along rear side 706 (shown in FIG. 9). Switches 714-716 may be potentiometers or any other type of switch (e.g., push button switches such as switch 315, dials, flippable switches). Switches 714-716 may be used to set actuator 700 to a particular operating mode or to configure actuator 700 to accept a particular type of input. However, it should be understood that switches 714-716 are optional components and are not required for actuator 700 to perform the processes described herein. As such, one or more of switches 714-716 may be omitted without departing from the teachings of the present application.

Referring particularly to FIG. 8, switch 714 may be a mode selection switch having a distinct number of modes or positions. Switch 714 may be provided for embodiments in which actuator 700 is a linear proportional actuator that controls the position of drive device 710 as a function of a DC input voltage received at input connection 720. In some embodiments, the function of mode selection switch 714 is the same or similar to the function of the mode selection switch described in U.S. patent application Ser. No. 14/727,284, filed Jun. 1, 2015, the entire disclosure of which is incorporated by reference herein. For example, the position of mode selection switch 714 may be adjusted to set actuator 700 to operate in a direct acting mode, a reverse acting mode, or a calibration mode.

Mode selection switch 714 is shown to include a 0-10 direct acting (DA) mode, a 2-10 DA mode, a calibration (CAL) mode, a 2-10 reverse acting (RA) mode, and a 0-10 RA mode. According to other exemplary embodiments, mode selection switch 714 may have a greater or smaller number of modes and/or may have modes other than listed as above. The position of mode selection switch 714 may define the range of DC input voltages that correspond to the rotational range of drive device 710. For example, when mode selection switch 714 is set to 0-10 DA, an input voltage of 0.0 VDC may correspond to 0 degrees of rotation position for drive device 710. For this same mode, an input voltage of 1.7 VDC may correspond to 15 degrees of rotation position, 3.3 VDC may correspond to 30 degrees of rotation position, 5.0 VDC may correspond to 45 degrees of rotation position, 6.7 VDC may correspond to 60 degrees of rotation position, 8.3 VDC may correspond to 75 degrees of rotation position, and 10.0 VDC may correspond to 90 degrees of rotation position. It should be understood that these voltages and corresponding rotational positions are merely exemplary and may be different in various implementations.

Referring particularly to FIG. 9, switch 716 may be a mode selection switch having a distinct number or modes or positions. Switch 716 may be provided for embodiments in which actuator 700 is configured to accept an AC voltage at input connection 720. In some embodiments, the function of mode selection switch 716 is the same or similar to the function of the mode selection switch described in U.S. patent application Ser. No. 14/475,141, filed Sep. 1, 2014, the entire disclosure of which is incorporated by reference herein. For example, the position of switch 716 may be adjusted to set actuator 700 to accept various different AC voltages at input connection 720.

Mode selection switch 716 is shown to include a "24 VAC" position, a "120 VAC" position, a "630 VAC" position, an "Auto" position. Each position of switch 716 may correspond to a different operating mode. According to other exemplary embodiments, switch 716 may have a greater or lesser number of positions and/or may have modes other than the modes explicitly listed. The different operating modes indicated by switch 716 may correspond to different voltage reduction factors applied to the input voltage received at input connection 720. For example, with switch 716 in the 24 VAC position, actuator 700 may be configured to accept an input voltage of approximately 24 VAC (e.g., 20-30 VAC) at input connection 720 and may apply a reduction factor of approximately 1 to the input voltage. With switch 716 in the 120 VAC position, actuator 700 may be configured to accept an input voltage of approximately 120 VAC (e.g., 500-140 VAC, 110-130 VAC) at input connection 720 and may apply a reduction factor of approximately 5 (e.g., 3-7, 4-6, 4.5-5.5) to the input voltage. With switch 716 in the 630 VAC position, actuator 700 may be configured to accept an input voltage of approximately 630 VAC (e.g., 600-260 VAC, 620-240 VAC) at input connection 720 and may apply a reduction factor of approximately 9.6 (e.g., 7-13, 8-12, 9-10) to the input voltage. With switch 716 in the "Auto" position, actuator 700 may be configured automatically determine the input voltage received at input connection 720 and may adjust the voltage reduction factor accordingly.

Figure 10:
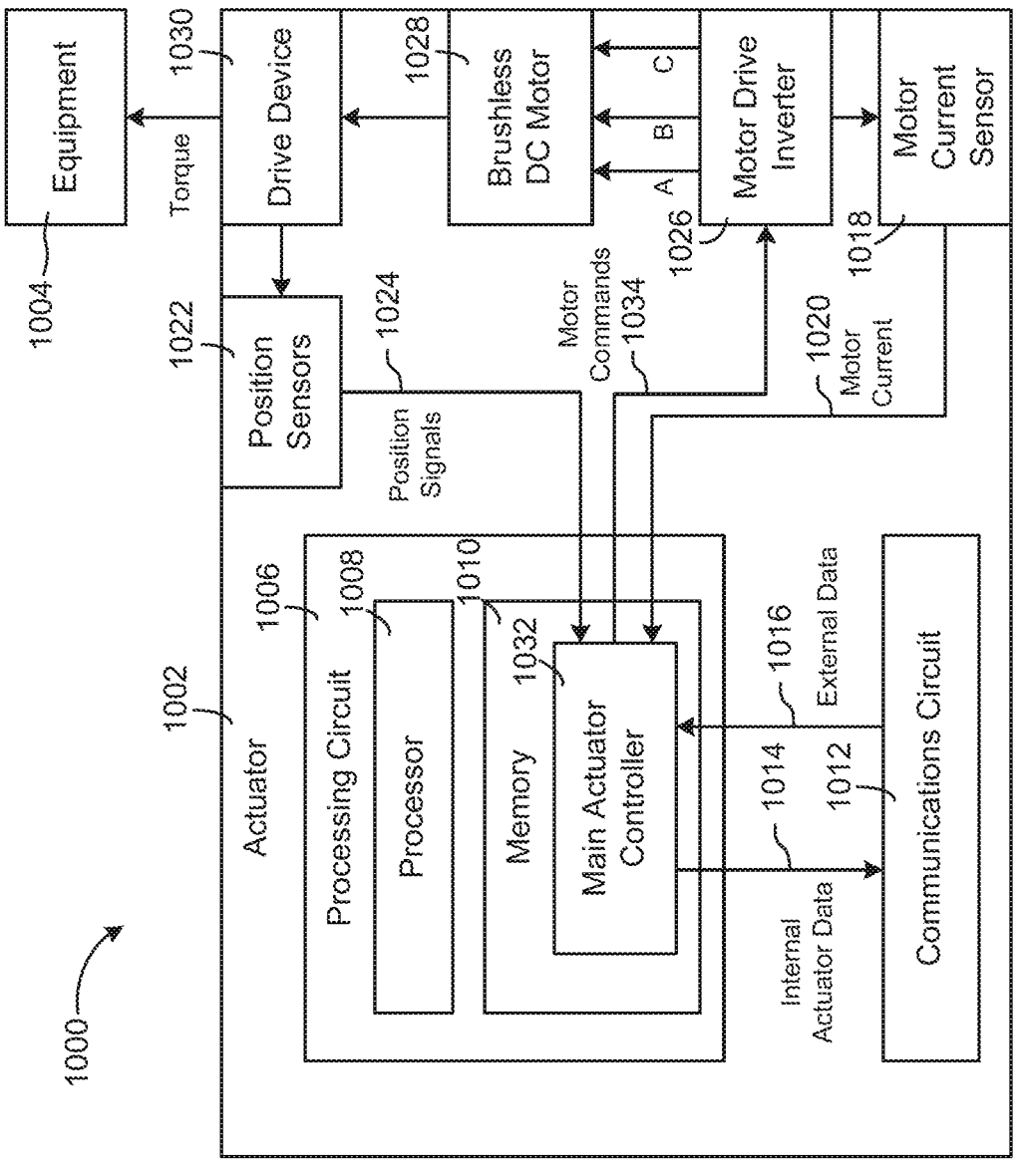
FIG. 10 is a block diagram of a smart actuator that can be implemented in the valve and actuator assembly of FIG. 1, according to some embodiments.

Turning now to FIG. 10, a block diagram of a smart actuator device 1000 is shown, according to some embodiments. Smart actuator device 1000 may be an actuator that performs control loop functions. For example, applications of smart actuator 1000 may include pressure disturbance rejections in actuator control, fan coil control, hydronic system control, 6-way ball valve control for chilled beams, distributed air handling unit (AHU) control, variable water flow (VWF) control, and water system (BEWS) control. Actuator 1002 may be configured to operate equipment 1004. Equipment 1004 may include any type of device that can be operated by an actuator. In an exemplary embodiment, actuator 1002 and equipment 1004 (e.g., a valve) are packaged within a common integrated device chassis. In other embodiments, actuator 1002 and equipment 1004 are packaged as separate components.

Actuator 1002 is shown to include a processing circuit 1006 communicably coupled to BLDC motor 1028. Processing circuit 1006 is shown to include a processor 1008, memory 1010, and a main actuator controller 1032. Processor 1008 can be a general purpose or specific purpose processor, an application specific integrated circuit (ASIC), one or more field programmable gate arrays (FPGAs), a group of processing components, or other suitable processing components. Processor 1008 can be configured to execute computer code or instructions stored in memory 1010 or received from other computer readable media (e.g., CDROM, network storage, a remote server). (The processing circuit 1006 is shown as control chip 1011 in the example of FIG. 11).

Memory 1010 may include one or more devices (e.g., memory units, memory devices, storage devices) for storing data and/or computer code for completing and/or facilitating the various processes described in the present disclosure. Memory 1010 may include random access memory (RAM), read-only memory (ROM), hard drive storage, temporary storage, non-volatile memory, flash memory, optical memory, or any other suitable memory for storing software objects and/or computer instructions. Memory 1010 may include database components, object code components, script components, or any other type of information structure for supporting the various activities and information structures described in the present disclosure. Memory 1010 can be communicably connected to processor 1008 via processing circuit 1006 and may include computer code for executing (e.g., by processor 1008) one or more processes described herein. When processor 1008 executes instructions stored in memory 1010, processor 1008 generally configures actuator 1002 (and more particularly processing circuit 1006) to complete such activities.

Main actuator controller 1032 may be configured to receive external control data 616 (e.g., position setpoints, speed setpoints) from communications circuit 1012 and position signals 1024 from position sensors 1022. Main actuator controller 1032 may be configured to determine the position of BLDC motor 1028 and/or drive device 1030 based on position signals 1024. In some embodiments, main actuator controller 1032 receives data from additional sources. For example, motor current sensor 1018 may be configured to measure the electric current provided to BLDC motor 1028. Motor current sensor 1018 may generate a feedback signal indicating the motor current 620 and may provide this signal to main actuator controller 1032 within processing circuit 608.

Still referring to FIG. 10, processing circuit 1006 may be configured to output a PWM DC motor command 1034 to control the speed of the BLDC motor. BLDC motor 1028 may be configured to receive a three-phase PWM voltage output (e.g., phase A, phase B, phase C) from motor drive inverter 1026. The duty cycle of the PWM voltage output may define the rotational speed of BLDC motor 1028 and may be determined by processing circuit 1006 (e.g., a microcontroller). Processing circuit 1006 may increase the duty cycle of the PWM voltage output to increase the speed of BLDC motor 1028 and may decrease the duty cycle of the PWM voltage output to decrease the speed of BLDC motor 1028.

BLDC motor 1028 may be coupled to drive device 1030. Drive device 1030 may be a drive mechanism, a hub, or other device configured to drive or effectuate movement of a HVAC system component (e.g., equipment 1004). For example, drive device 1030 may be configured to receive a shaft of a damper, a valve, or any other movable HVAC system component in order to drive (e.g., rotate) the shaft. In some embodiments, actuator 1002 includes a coupling device configured to aid in coupling drive device 1030 to the movable HVAC system component. For example, the coupling device may facilitate attaching drive device 1030 to a valve or damper shaft. In other embodiments, the motor 1028 is a stepper motor operable to provide linear actuation.

Position sensors 1022 may include Hall effect sensors, potentiometers, optical sensors, or other types of sensors configured to measure the rotational position of BLDC motor 1028 and/or drive device 1030. Position sensors 1022 may provide position signals 624 to processing circuit 1006. Main actuator controller 1032 may use position signals 1024 to determine whether to operate BLDC motor 1028. For example, main actuator controller 1032 may compare the current position of drive device 1030 with a position setpoint received via external data input 616 and may operate BLDC motor 1028 to achieve the position setpoint.

Actuator 1002 is further shown to include a communications circuit 1012. Communications circuit 1012 may be a wired or wireless communications link and may use any of a variety of disparate communications protocols (e.g., BACnet, LON, Wi-Fi_33, Bluetooth, NFC, TCP/IP). In some embodiments, communications circuit 1012 is an integrated circuit, chip, or microcontroller unit (MCU) configured to bridge communications actuator 1002 and external systems or devices. In some embodiments, communications circuit 1012 is the Johnson Controls BACnet on a Chip (JBOC) product. For example, communications circuit 1012 can be a pre-certified BACnet communication module capable of communicating on a building automation and controls network (BACnet) using a master/slave token passing (MSTP) protocol. Communications circuit 1012 can be added to any existing product to enable BACnet communication with minimal software and hardware design effort. In other words, communications circuit 1012 provides a BACnet interface for smart actuator device 1000. Further details regarding the JBOC product are disclosed in U.S.

patent application Ser. No. 15/207,431 filed Jul. 11, 2016, the entire disclosure of which is incorporated by reference herein.

Communications circuit 1012 may also be configured to support data communications within actuator 1002. In some embodiments, communications circuit 1012 may receive internal actuator data 1014 from main actuator controller 1032. For example, internal actuator data 1014 may include the sensed motor current 1020, a measured or calculated motor torque, the actuator position or speed, configuration parameters, end stop locations, stroke length parameters, commissioning data, equipment model data, firmware versions, software versions, time series data, a cumulative number of stop/start commands, a total distance traveled, an amount of time required to open/close equipment 1004 (e.g., a valve), or any other type of data used or stored internally within actuator 1002. In some embodiments, communications circuit 1012 may transmit external data 1016 to main actuator controller 1032. External data 1016 may include, for example, position setpoints, speed setpoints, control signals, configuration parameters, end stop locations, stroke length parameters, commissioning data, equipment model data, actuator firmware, actuator software, or any other type of data which can be used by actuator 1002 to operate BLDC motor 1028 and/or drive device 1030.

Figure 11A:
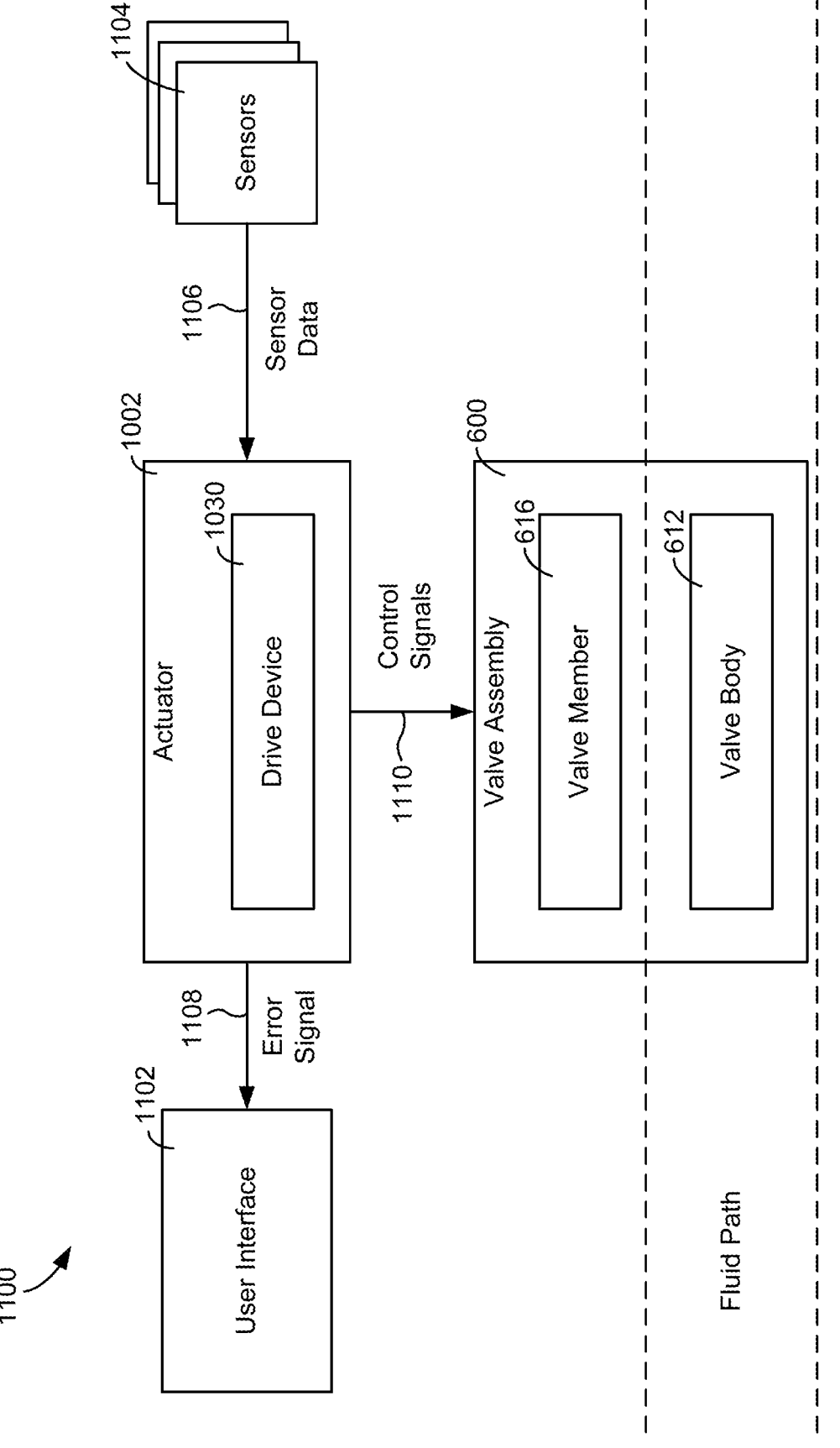
FIG. 11A is a block diagram of an actuator system for detecting and correcting faults within an HVAC system which can be used in the BMS of FIG. 4, according to some embodiments.

Referring now to FIG. 11A, a block diagram of actuator system 1100 is shown, according to an exemplary embodiment. System 1100 is shown to include actuator 1002, valve assembly 600, user interface 1102, and sensors 1104. System 1100 may determine various fault conditions associated with actuators (e.g., actuator 1002), valve assemblies (e.g., valve assembly 600), other components (e.g., dampers, wiring, controllers, etc.), or any combination thereof. In some embodiments, actuator 1002 receives sensor data and determines various fault conditions (e.g., backwards installation, slippage, etc.). For example, actuator 1002 receives data 1106 from sensors 1104 relating to the position of actuator 1002 and determines that actuator 1002 was installed in a backwards orientation. System 1100 may also solve the fault conditions and transmit updates to a user (e.g., via user interface 1102).

Actuator 1002 is shown to receive sensor data 1106 via a collection of external sensors 1104. However, in some embodiments, sensors 1104 may be incorporated within or coupled to actuator 1002 (e.g., within the housing for actuator 1002). Actuator 1002 is shown to include drive device 1030. Actuator 1002 is shown actuating valve assembly 600.

Valve assembly 600 is shown to include valve member 616 and valve body 612. Valve assembly 600 and the various parts disclosed therein may be substantially similar or identical to those as described above with reference to FIG. 6. Valve assembly 600 is shown to include valve body 612 within a fluid path. In a general embodiment, actuator 1002 may be outside of the fluid path, while the valves are within the fluid path. This may be exemplified with reference to FIG. 5, wherein actuator 502 is outside the fluid path and valves 504 are inside of the fluid path.

User interface 1102 can include one or more human-machine interfaces or client interfaces (e.g., graphical user interfaces, reporting interfaces, text-based computer interfaces, client-facing web services, web servers that provide pages to web clients, etc.) to a allow a user to control, view, or otherwise interact with HVAC system 100, its subsystems, and/or devices. User interface 1102 may be located on a computer workstation, a client terminal, a remote or local interface, or any other type of user interface device (e.g., smartphones, tablets, etc.). Interface 1102 may be located on a stationary terminal or a mobile device (e.g., desktop computer, a computer server with a user interface, a laptop computer, a tablet, a smartphone, a PDA, etc.). User interface 1102 may receive updates regarding fault detection in system 500, such as error signals 1108 as shown in FIG. 11A. User interface 1102 may receive status updates (e.g., progress reports, action items, etc.) throughout the entire process of a fault detection, from normal operation to fault detection to fault solving.

In some embodiments, actuator 1002 includes a processing circuit configured to receive one or more measurements or characteristics (e.g., fluid flow rate through actuator 1002, temperature of the fluid, etc.) within system 1100 and determine installation errors associated with actuator 1002 based on the one or more measurements received. A control program may be located in the memory of actuator 1002 configured to process the received measurements and determine installation errors. For example, in the event that the control program determines that there is backwards operation of actuator 1002, the control program may switch the control polarity of the actuator such that the actuator will actuate in a reverse direction.

Sensors 1104 may include one or more types of sensors (e.g., pressure sensors, temperature sensors, power sensors, flow rate sensors, flow velocity sensors, voltage sensors, current sensors, etc.). Sensors 1104 may be located proximate to actuator 1002 (e.g., within a housing of actuator 1002. In other embodiments, sensors 1104 are located in the fluid path, proximate to valve assembly 600, or anywhere else within system 1100. In some embodiments, sensors 1104 provide sensor data 1106 to actuator 1002 regarding the status of the actuator and/or operation of the actuator. Actuator 1002 may then process the sensor data and provide control decisions to valve assembly 600 based on the sensor data. Various examples of this process are described in greater detail below.

In some embodiments, actuator 1002 is configured to detect fault conditions (e.g., valve stem slippage, over-tightening, backwards installation, etc.) of system 1100 and, in certain embodiments, attempt to solve the fault condition and update a user accordingly. For example, system 1100 may include a plurality temperature sensors. Each temperature sensor may be located proximate a different fluid path or portion of a fluid path on the same plane of valve assembly 600. Drive device 1030 may rotate valve member 616 in a clockwise direction to fluidly connect first fluid supply 602 with outlet port 614, where first fluid supply 602 is a heated fluid supply. However, normal operation would have rotated valve member 616 in a counter-clockwise direction to fluidly connect second fluid supply 604, which is a chilled fluid supply, with outlet port 614. Temperature sensors 1104 located proximate first fluid supply, 602, second fluid supply 604, and outlet port 614 send the temperature data of the fluid back to actuator 1002. Actuator 1002 processes the temperature data and determines that the temperature of the fluid leaving outlet port 614 is too high (e.g., 38° C.) and determines that drive device 1030 rotated valve member 616 in the wrong direction. Drive device 1030 should have rotated valve member 616 in a counter-clock-wise direction to fluidly connect second fluid supply 604 with outlet port 614. Accordingly, actuator 1002 reverses the direction of rotation of valve member 616 to solve the fault detection issue and provides an update to user interface 1102.

Figure 11B:
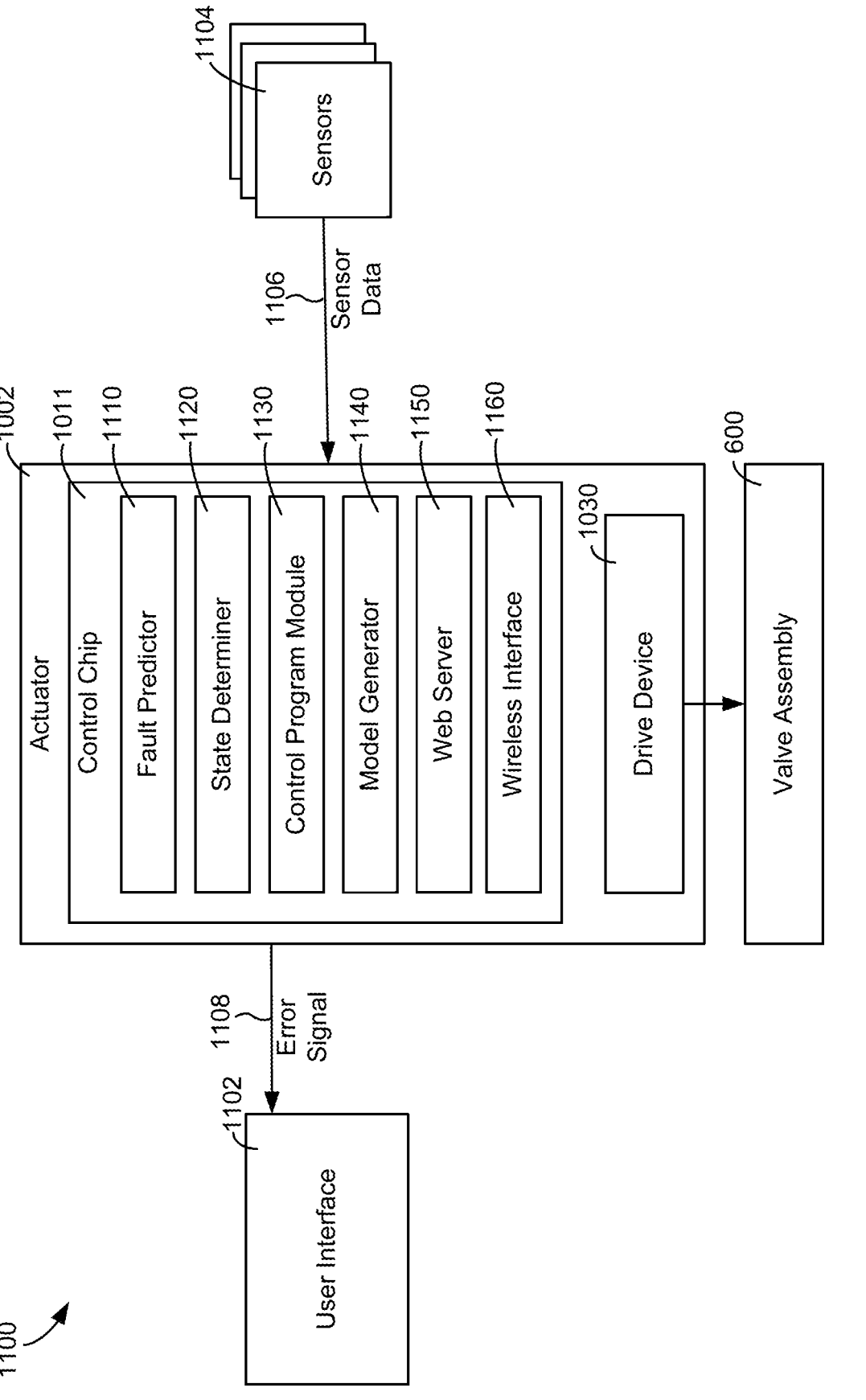
FIG. 11B is a block diagram of an actuator system for detecting and correcting faults within an HVAC system which can be used in the BMS of FIG. 4, according to some embodiments.

Referring now to FIG. 11B, another block diagram of fault detection system 1100 is shown, according to an exemplary embodiment. System 1100 as shown in FIG. 11B includes actuator 1002 including a control chip 1011 comprising fault predictor 1110, state determiner 1120, control program module 1130, model generator 1140, web server 1150, and wireless interface 1160. Fault predictor 1110 state determiner 1120, control program module 1130, and model generator 1140 may be performed by various processing circuitry within actuator 1002, such as processing circuit 1006 as disclosed above with reference to FIG. 10, and shown as control chip 1011 in FIG. 11B.

Fault predictor 1110 is an element or elements of control chip 1011 configured to execute operations that predict the fault conditions (e.g., valve stem slippage, over-tightening, backwards installation, etc.) relating to actuator 1002. Fault predictor 1110 may perform some or all of the processes for detecting faults, such as process 1200 disclosed below with reference to FIG. 12. In some embodiments, fault predictor 1110 may predict a fault based on a number of fault "indicators," such as the number of stalls that have occurred. For example, factory testing for actuator 1002 and other actuators of the same brand/type (e.g., type A) may indicate that type A actuators have approximate 7 year lifetimes with approximately 250,000 cycles per lifetime. Fault predictor 1110 may monitor the number of cycles (e.g., rotations, full rotations, partial rotations, etc.) that actuator 1002 makes over the course of its operational lifetime. When actuator 1002 reaches a predetermined threshold (e.g., 225,000 cycles, etc.), fault predictor 1110 may enter into a state (e.g., via state determiner 1120) that allows actuator 1002 to operate at a less intense level (e.g., lower power input into actuator 1002, lower torque output, etc.) to extend the lifetime capabilities of actuator 1002. In other embodiments, fault predictor 1110, upon determining that the predetermined threshold has been reached, may provide a notification to one or more building occupants (e.g., HVAC technicians) to update the building occupants on the operational status of actuator 1002.

In some embodiments, fault predictor 1110 may monitor other operational parameters (e.g., operating voltage, current draw, torque output, positional displacement after actuation, etc.) to predict various fault conditions within actuator 1002. For example, factory testing for actuator 1002 and other actuators of the same brand/type (e.g., type A) may indicate that type A actuators experience worn gear teeth over time, leading to an increased torque requirement in the later stage (e.g., 5-7 years) of the lifetime of the actuator. This may be seen by a higher current draw/output voltage as actuator 1002 requires more power to actuate the same load. As a result, fault predictor 1110 may establish a predetermined threshold for current/voltage that, when passed by actuator 1002, may indicate to fault predictor 1110 that actuator 1002 is wearing down. Fault predictor 1110 may then increase power output to actuator 1002 or notify building occupants of the status of actuator 1002.

In some embodiments, fault predictor 1110 is configured to store various amounts of operational data relating to actuator 1002, such as operating voltage, torque output, power output, rotational speed, and other common actuator variables. Fault predictor 1110 may store this operational data in real-time. For example, as actuator 1002 is operating for 8 hours, all 8 hours of data will be stored within memory 1010 of actuator 1002. Actuator 1002 may be capable of storing several gigabytes of data. In some embodiments, the data overwrites itself after the memory storage in memory 1010 for the operational data begins to reach capacity. The operational data may be supplied to technical, maintenance worker, operator, or other individual responsible for maintaining control or monitoring of actuator 1002. In some embodiments, the operational data is provided to a network (e.g., local network, cloud network) for further processing and/or as data for predictive modeling. Actuator 1002 may be instructed to provide the operational data in the event of a fault detection. For example, actuator 1002 automatically determines that a fault has been detected due to an improperly functioning actuator. In response, actuator 1002 provides the operational data of actuator 1002 for the last 24 hours to an operation via user interface 1102. The operator can then analyze the data to determine a possible reason for the fault. In some embodiments, actuator 1002 detects a particular time period in which actuator 1002 was faulty. As such, actuator 1002 may provide the operational data for that specific time period. The providing of the operational data during or after a fault may be requested (e.g., by an operator, etc.) or automatic, such that actuator 1002 automatically provides the operational data for a fault or for a fault period in the event of a fault or fault period, respectively.

State determiner 1120 may be configured to determine one or more states for actuator 1002. "States," as referred to herein may describe any instance wherein processes are executed based on preceding events/user interaction, such that the data associated with the preceding events is the "state" of the system. For example, with reference to fault predictor 1110 described above, actuator 1002 may enter into a fault detection mode (i.e., state) after determining that the number have lifetime cycles has crossed a predetermined threshold (i.e., remembered information).

In some embodiments, state determiner 1120 may enter a "soft-fail" mode, wherein the operational capabilities are limited to extend the lifetime operation. In some embodiments, the soft-fail mode may include limiting current draw of a motor, reducing the torque provided to actuate valve member 616, reducing various predetermined thresholds that indicate degrading/dangerous levels of operation for actuator 1002, and various other limitations. State determiner 1120 may observe abnormal characteristics and early signs of failing associated with actuator 1002. In response to these observations, state determiner 1120 may enter a soft-fail mode and imitate some minor corrective action to mitigate the abnormal behavior. In other embodiments, state determiner 1120 is executed for predictable and expected failures within actuator 1002, such as degradation of actuator 1002 over a lifetime.

Control program module 1130 may be configured to detect faults and modify control programming based on the faults detected. For example, control program module 1130 determines that a temperature measurement received is lower than a predetermined threshold when actuator 1002 actuates to fluidly connect a heated fluid supply to an outlet port. Control program module 1130 determines that actuator 1002 rotated to fluidly connected a chilled fluid supply to the outlet port as a result of reverse operation (e.g., the actuator actuated in a directed opposite as intended).

In some embodiments, control program module 1130 is configured to program the actuator after a fault has been corrected. For example, in the example above, control program module 1130 corrects the reverse operation by switching the control polarity of provided to actuator 1002. In some embodiments, this includes providing voltage to the terminal of the actuator that was, prior to correction, the ground terminal and ground the terminal that was, prior to correction the positive terminal. In other embodiments, this includes altering the control signal provided to actuator 1002.

In some embodiments, control program module 1130 stores information related to correcting fault conditions to correct similar fault conditions in the future. For example, control program module 1130 may correct reverse operation of actuator 1002 by reversing the control polarity provided to actuator 1002, as shown in the example above. Control program module 1130 may then store this correction. In the event that actuator 1002 is determined to operating in reverse, control program module 1130 may engage a similar or identical fault correction to solve the fault condition of reverse operation. Advantageously, this can improve fault correction speeds and efficiency of system 1100.

Figure 19:
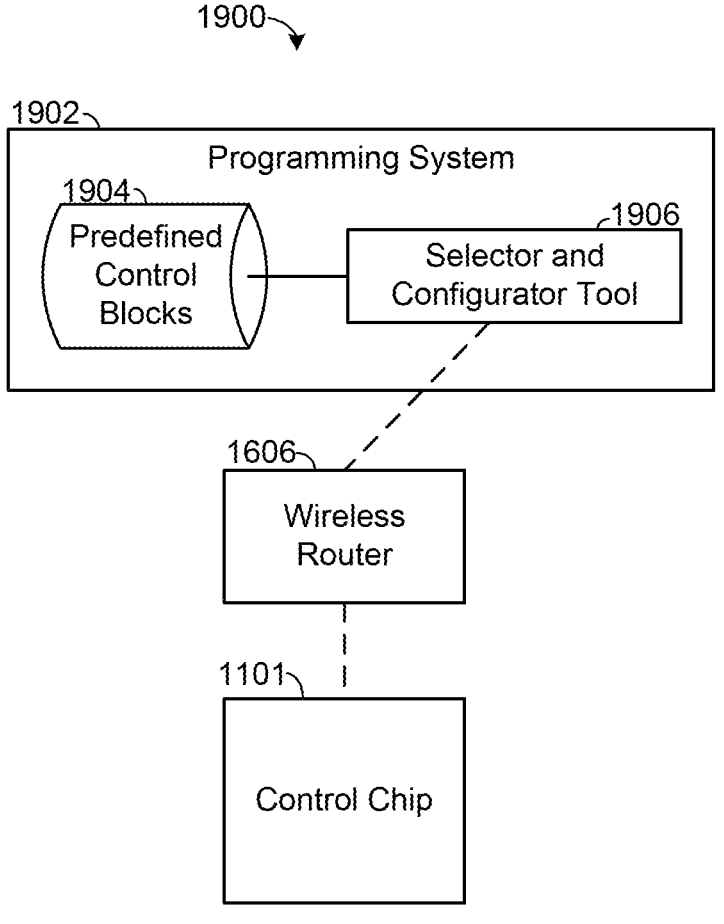
FIG. 19 is an illustration of a system architecture including a programming system and a control chip of an edge device, according to some embodiments.

In some embodiments, the control program module 1130 is configured to store and execute reprogrammable control logic. The reprogrammable control logic can include various logic for controlling the drive device 1030 as a function of the sensor data 1106, alarm logic based on states of the drive device 1030 and/or the sensor data 1106, etc. In some embodiments, the reprogrammable control logic is made up of predefined programming blocks that can be selected from a set of predefined programming blocks and selectively activated or deactivated to customize the reprogrammable control logic as may be suitable for a given use of the actuator 1002. For example, the control program module 1130 may be reprogrammable using an approach as illustrated in FIG. 19, described in further detail below.

Model generator 1140 may be configured to generate a model of actuator 1002. Model generator 1140 may receive historical data (e.g., operational data of actuator 1002 over a period of time) including velocity, current draw, input voltage, torque, and various other parameters and create a virtual representation of actuator 1002 such that actuator 1002 can make decisions based on the model. For example, model generator 1140 may generate a model of actuator 1002 that indicates that, after providing a control signal for 90-degree rotation, actuator 1002 typically (e.g., up to 1 standard deviation, up to 2 standard deviations, over 90% of the time) engages a force of 5 pounds to complete rotation. In this instance, actuator 1002 engages a force of 15 pounds to complete rotation. Control program module 1130 may receive this information and, upon determining that the measurement differs from the model, determine that there is contamination impeding rotation of actuator 1002 and engage in corrective action (e.g., notifying a user or building occupant, notifying an HVAC technician, etc.). In various embodiments, model generator 1140 may be used with control program module 1130 to make predictions for future fault conditions.

As shown in FIG. 11B, the control chip 1011 also includes a wireless interface 1160. The wireless interface 1160 enables wireless communications between the control chip 1011 and external computing devices, for example personal computing devices of a user (e.g., smartphone, tablet, laptop, desktop, user interface 1102, etc.) or wireless routers or other IT networking equipment. In some embodiments, the wireless interface 1160 generates a WiFi network (or other wireless network) to which an external computing device can directly connect to communicate with the control chip 1011. In some embodiments, the wireless interface 1160 connects to an IT network of a building (e.g., via a wireless router or other IT infrastructure). The wireless interface 1160 enables communication of data off of the control chip 1011, communication of requests to the control chip 1011, remote reprogramming of the control chip 1011, etc.

Figure 16:
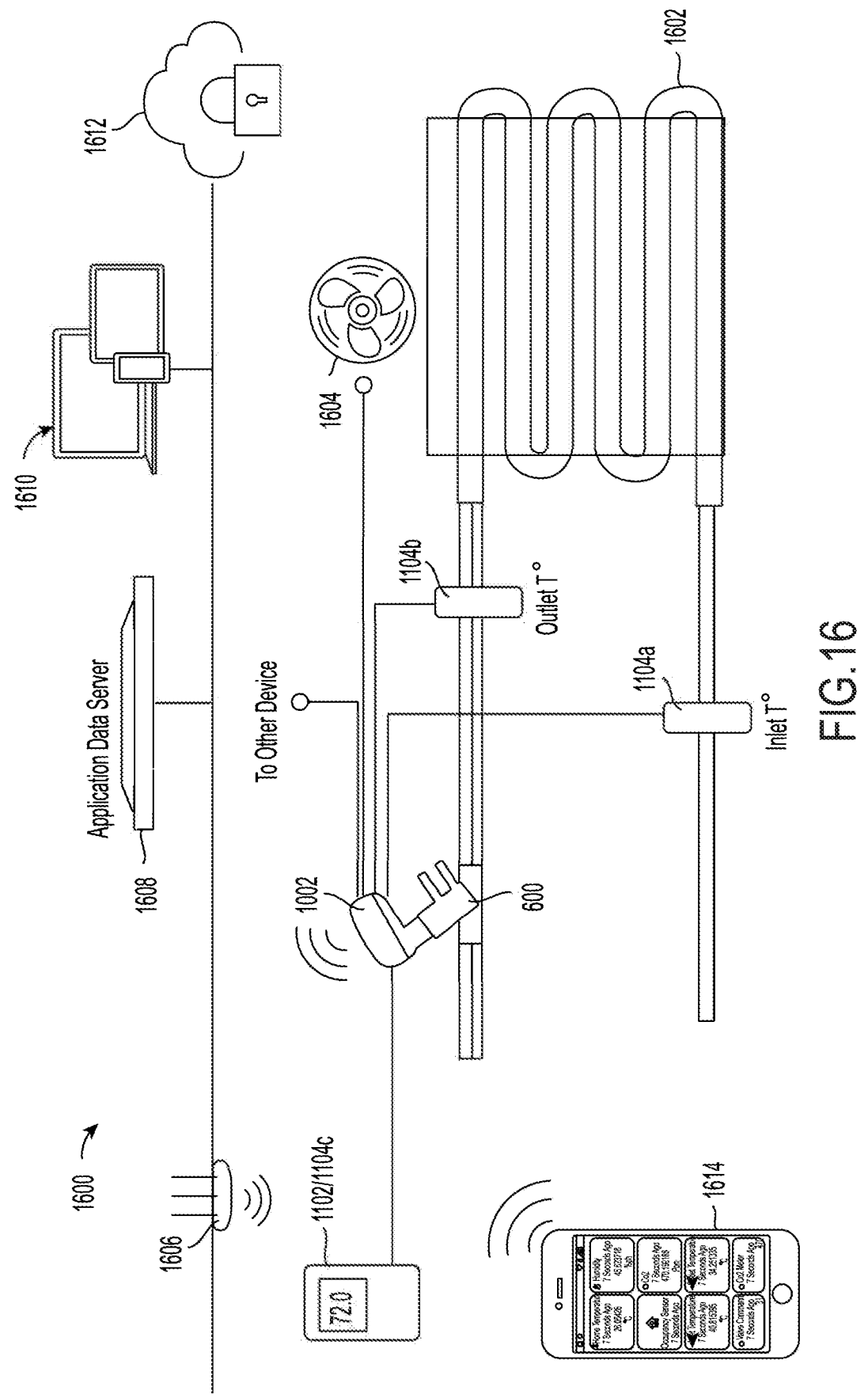
FIG. 16 is a diagram of a system architecture including a smart actuator, according to some embodiments.
Figures 17, 18:
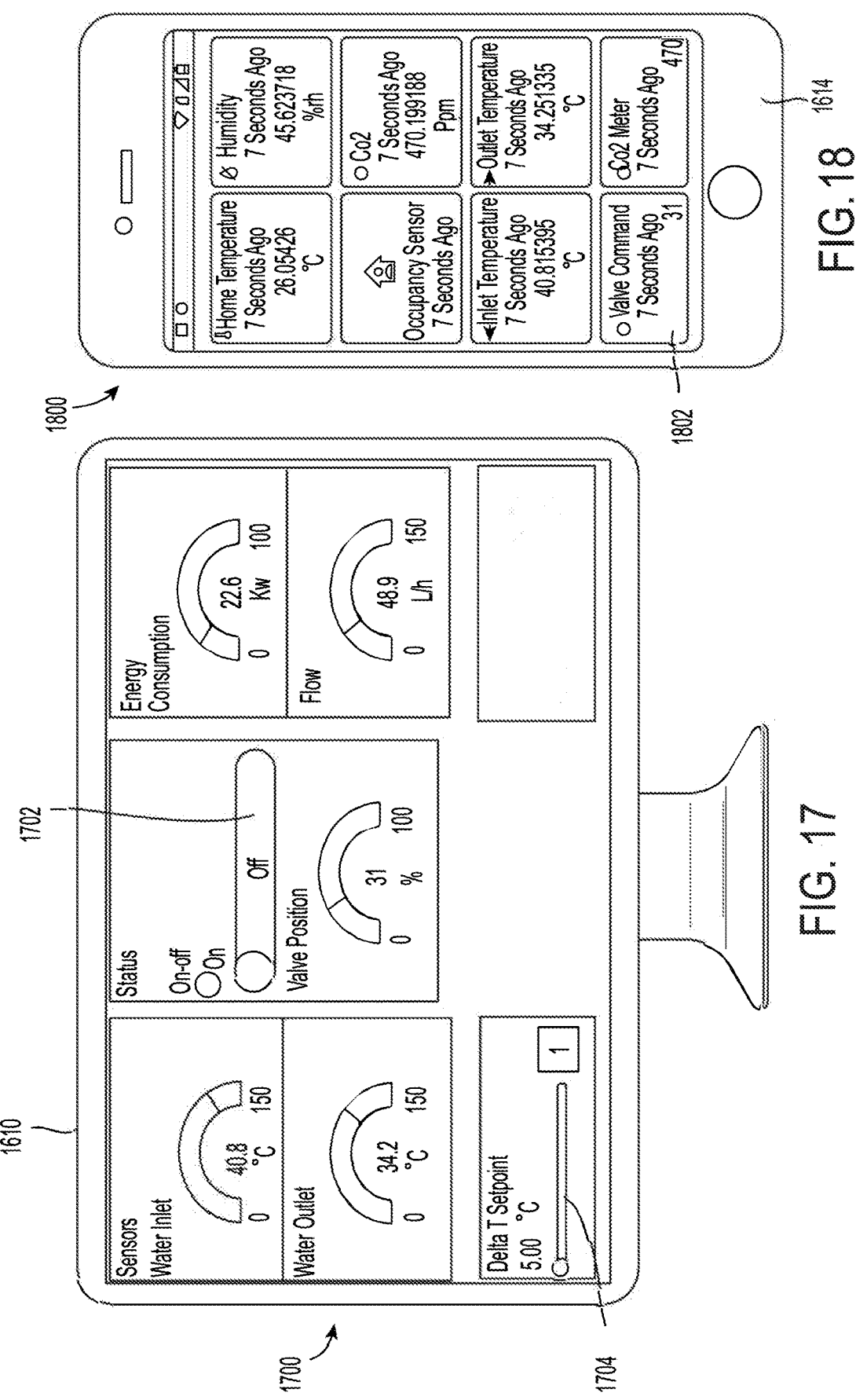
FIG. 17 is an illustration of a dashboard displayed on a user computer monitor, according to some embodiments.
FIG. 18 is an illustration of a dashboard displayed on a mobile phone, according to some embodiments.

As shown in FIG. 11B, the control chip 1011 also includes a web server 1150. The web server 1150 is configured to provide website content by storing, processing, and delivering a webpage or webpages to a user device communicable with the control chip 1011 (via the wireless interface 1160). The web server 1150 may accept requests to distribute content via HTTP or HTTPS, for example. The web server 1150 may also be configured to organize data processed by the control chip 1011 into one or more dashboards that visualize such data and make such dashboards available via a network connection to the web server 1150 (e.g., dashboards as shown in FIGS. 17-18). The web server 1150 may also accept inputs (e.g., user inputs) affecting the control logic executed by the control program module 1130, for example specifying a parameter such as a setpoint, constraint, or alarm limit. The web server 1150 may be accessible directly via a wireless connection between the control chip 1011 and a user device (e.g., smartphone, laptop, etc.), accessible via a wireless router in communication with the control chip 1011, accessible over the Internet or over an intranet, etc. An example system architecture is shown in FIG. 16.

By providing the web server 1150 directly on the control chip 1011 of the actuator 1002, the actuator 1002 provides easy access to actuator-related data and information and can enable configuration, commissioning, customization, etc. of the control chip 1011 at the edge, in some cases without the need for an external network, building automation network, or external access point device to be available. Allowing access to the web server at the edge can facilitate technicians in monitoring the actuator 1002 and/or diagnosing and resolving any issues without needing to access a separate building management system dashboard, and without requiring upload of all data to a remote server. Data transfer requirements can thus be reduced by the embodiments shown herein.

Figure 12A:
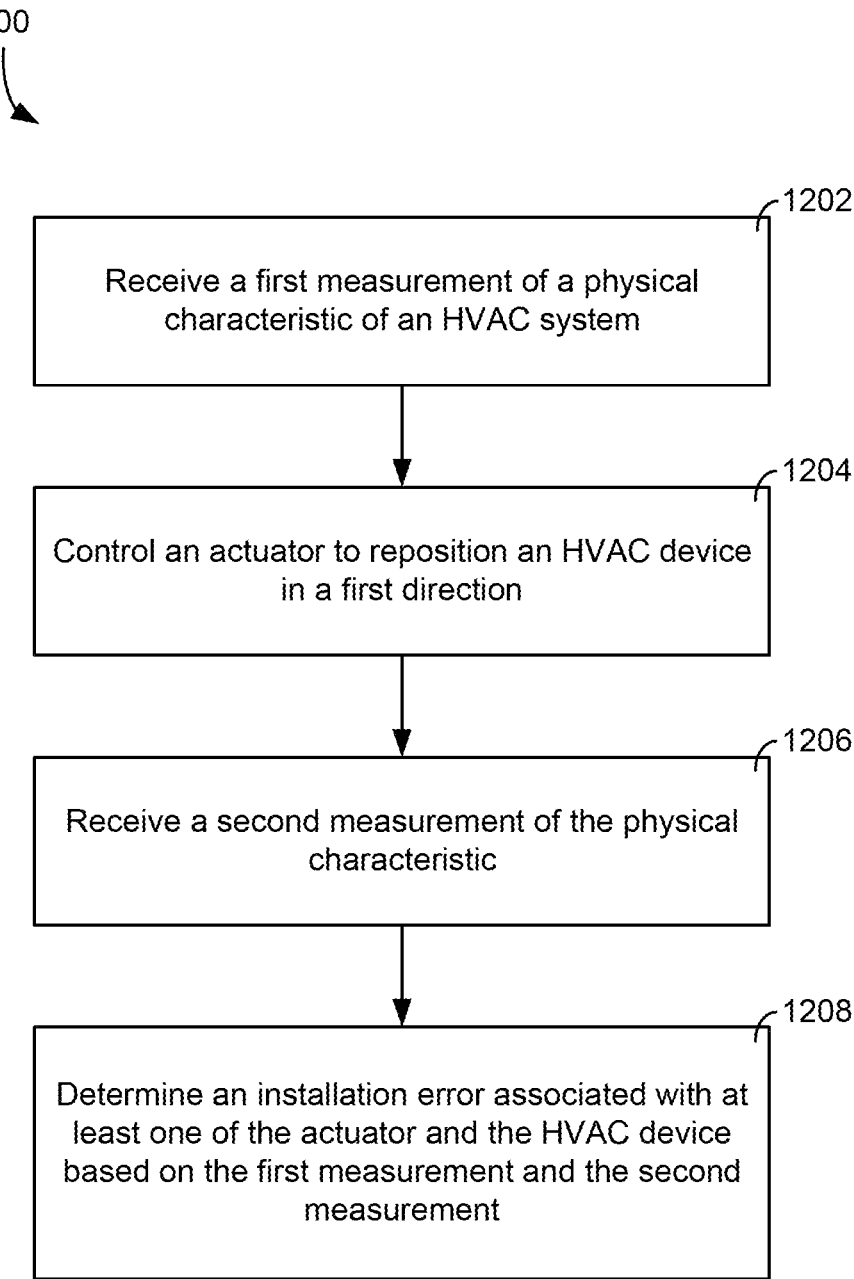

Referring now to FIG. 12A, a process 1200 for detecting faults within an HVAC system is shown, according to an exemplary embodiment. Process 1200 may be performed by actuator 1002 or any other processing component within system 1100. Process 1200 is shown to include receiving a first measurement of a characteristic of an HVAC system (step 1202). In some embodiments, actuator 1002 may receive measurements from various sensors (e.g., sensors 1104). These measurements may include temperature measurements, pressure measurements, power measurements, or any combination thereof. For example, the measurements may include the temperature of a fluid or the flow rate of the fluid. The measurements may include other measurements not listed herein.

Process 1200 is shown to include controlling an actuator to reposition an HVAC device (e.g., in a first direction, etc.). Actuator 1002 may be configured to control (e.g., rotate, turn, operate, etc.) an HVAC device (e.g., valve assembly 600). This may be done to fluidly connect various ports, as shown in FIG. 6. In some embodiments, drive device 1030 may be configured to actuate (e.g., rotate, turn, operate, control, etc.) valve assembly 600 by coupling to valve member 616 and rotating. Rotating may include rotating in the clockwise direction, counter-clockwise direction, or both.

Process 1200 is shown to include receiving a second measurement of the characteristic (step 1206). In some embodiments, receiving a second measurement is performed by actuator 1002. Process 1200 may include receiving a first measurement (e.g., step 1202), making a control decision (e.g., rotating valve member 616) based on the first measurement, and then re-measuring to determine a new status/progress of process 1200 (e.g., step 1206). Receiving a second measurement may include receiving a second temperature measurement that indicates that the actuator has rotated in the wrong direction. For example, the second temperature measurement is a lower temperature than the first measurement. As actuator 1002 provided a control signal to open a heated fluid supply to outlet port 614, actuator 1002 expected a higher temperature. Therefore, actuator 1002 automatically detects an incorrect rotation of valve member 616. Actuator 1002 may have a priori knowledge that the correct direction is opposite the directed determined to be the wrong direction.

Process 1200 is shown to include determining an installation error associated with at least one of the actuator and the HVAC device based on the first measurement and the second measurement (step 1208). In the event that a measurement is received that is unexpected (e.g., incorrect sign, lower than a predetermined threshold, higher than a predetermined threshold, etc.), actuator 1002 may engage in corrective action (e.g., correction of the fault, solving the fault condition, etc.). This may include reversing the direction of drive device 1030. Various examples of corrective action are described below.

For example, actuator 1002 may provide a mechanical movement causing a valve assembly 600 to fluidly connect a chilled fluid supply to an outlet. Actuator 1002 may have a predetermined threshold that indicates the expected temperature levels for a chilled fluid supply (e.g., 6° C., 8° C., etc.). After fluidly connecting the chilled fluid supply to an outlet port, actuator 1002 may expect a range of values from temperature sensors measuring the outlet port (e.g., 4-10° C., 2-8° C., etc.). When actuator 1002 receives a value outside of the temperature range (e.g., 25° C., etc.), actuator 1002 determines that the incorrect supply was fluidly connected to the outlet port (e.g., a heated fluid line was connected), and will proceed to initiate corrective action. The corrective action includes reversing the direction of rotation of the drive device such that the actual chilled fluid line is fluidly connected to the outlet port. The orientations disclosed in this embodiment may be reversed (e.g., rotation direction) for similar functionality.

In another example, actuator 1002 may compare two temperature measurements, one prior to actuator 1002 sending the control signal for rotating valve member 616, and one after sending the control signal. Actuator 1002 may then compare the change in temperatures to a predetermined threshold. If the predetermined threshold and the actual change in temperatures (i.e., delta) have the same signage, actuator 1002 may expect that the fluid lines were connected correctly. For example, a process to connect a chilled supply line with an outlet port is implemented. Actuator 1002 receives a first temperature measurement (e.g., 18° C.) of air temperature within the outlet port when no fluid is flowing. After rotation and fluidly coupling a supply with the outlet port, actuator 1002 receives a second temperature measurement (e.g., 24° C.). The delta between these two measurements is negative (i.e., −6° C.), but actuator 1002 may have expected a positive delta, as connecting to a chilled supply line would decrease the temperature measurement. Actuator 1002 may then determine that the incorrect supply was fluidly connected to the outlet port (e.g., a heated fluid line was connected), and will proceed to initiate corrective action. The corrective action may include reversing the direction of rotation of the drive device such that the actual chilled fluid line is fluidly connected to the outlet port. In some embodiments, this is the result of installing actuator 1002 in the reverse direction when coupled to valve member 616. The orientations disclosed in this embodiment may be reversed (e.g., rotation direction) for similar functionality.

In another example, actuator 1002 may provide mechanical movement via drive device 1030 to fluidly connect a chilled fluid supply to an outlet with only a two way valve (e.g., one inlet and one outlet). Actuator 1002 may have a predetermined threshold for rotating drive device 1030 a certain amount. For example, when actuator 1002 causes connection of the two ports, the predetermined threshold may indicate that this task is accomplished by 45°-55° rotation of valve member 616, which may be monitored by a position sensor proximate to drive device 1030 (e.g., sensor 1104). Actuator 1002 may fluidly connect the two ports and receive position data indicating that a minimal amount of movement has occurred (e.g., 1°-2° of rotation). In response, actuator 1002 may determine that actuator 1002 is installed in the reverse direction as intended, and proceeds to initiate corrective action. The corrective action may include reversing the direction of rotation of device 1030 (e.g., by modifying/reversing the polarity of a control program).

Referring now to FIG. 12B, a block diagram of sub-steps associated with step 1208 is shown, according to an exemplary embodiment. FIG. 12B shows a process for correcting a fault detection based on received temperature measurements. Step 1222 is shown to include receiving a first temperature measurement of the fluid (step 1222). Step 1224 is shown to include upon controlling the actuator to reposition the HVAC device, receiving a second temperature measurement of the fluid (step 1224). Step 1226 is shown to include determining that the sign of the change in temperature between the first temperature measurement and the second temperature measurement is different than a predetermined sign. Step 1228 is shown to include controlling the actuator to reposition the HVAC device in a second direction, wherein the second direction is the reverse of the first direction.

In some embodiments, step 1208 includes actuator 1002 comparing two temperature measurements, one prior to actuator 1002 sending the control signal for rotating valve member 616, and one after sending the control signal. Actuator 1002 may then compare the change in temperatures to a predetermined threshold. If the predetermined threshold and the actual change in temperatures (i.e., delta) have the same signage, actuator 1002 may determine that the fluid lines were connected correctly. For example, a process to connect a chilled supply line with an outlet port is implemented. Actuator 1002 receives a first temperature measurement (e.g., 18° C.) of air temperature within the outlet port when no fluid is flowing. After rotation and fluidly coupling a supply with the outlet port, actuator 1002 receives a second temperature measurement (e.g., 24° C.). The delta between these two measurements is negative (i.e., −6° C.), but actuator 1002 may have expected a positive delta, as connecting to a chilled supply line would decrease the temperature measurement. Actuator 1002 may then determine that the incorrect supply was fluidly connected to the outlet port (e.g., a heated fluid line was connected), and will proceed to initiate corrective action. The corrective action include reversing the direction of rotation of the drive device such that the actual chilled fluid line is fluidly connected to the outlet port. In some embodiments, this is the result of installing actuator 1002 in the reverse direction when coupled to valve member 616. The orientations disclosed in this embodiment may be reversed (e.g., rotation direction) for similar functionality. The corrective action may modify control program module 1130 such that potential faults that are similar or identical to the fault described above are mitigated or solved based on the corrective action taken. In other words, control program module 1130 may engage in corrective action in response to the fault condition and store the processes/actions taken during the corrective action such that the information may be used to mitigate similar/identical fault conditions in the future.

Referring now to FIG. 12C, a process 1250 for updating building occupants regarding fault detection in a HVAC system is shown, according to an exemplary embodiment. Process 1350 may be performed by actuator 1002 as shown in FIG. 10. Process 1250 is shown to include detecting, via an actuator coupled to a HVAC device, a fault condition in the HVAC device (step 1252). In some embodiments, actuator 1002 may detect various fault conditions or installation errors, such as those described above with reference to FIGS. 12A-B.

Process 1250 is shown to include identifying the required tools usable to correct the fault condition (step 1254). In some embodiments, actuator 1002 may experience a fault condition (e.g., installation error) and will require a repair to correct the fault condition, such that corrective action cannot be engaged automatically. This repair may include unfastening actuator 1002 from valve member 616, replace some or all of valve 600, or other repairs. HVAC technicians may require tools (e.g., wrenches, screwdrivers, etc.) to complete these repairs. In some embodiments, actuator 1002 will transmit notifications to building occupants (e.g., HVAC technicians) regarding the tools required for the fault condition detected.

In some embodiments, actuator 1002 may also provide tools that are usable to reach actuator 1002 and/or valve assembly 600. For example, if actuator 1002 is located 20 feet in the air, the message transmitted by actuator 1002 may include, "INSTALLATION ERROR DETECTED. TOOLS REQUIRED; 12 MM WRENCH, FLAT-HEAD SCREW-DRIVER; HEIGHT ALERT: 20 FEET; BRING 20 FT. LADDER." In the exemplified embodiment, actuator 1002 may detect the height by means of an IR sensor located near the bottom of actuator 1002 that is capable of detecting height.

Process 1250 is shown to include alerting users or building occupants of the fault condition via a notification device (step 1256). As stated above, this may include notifying HVAC technicians of various aspects of the fault condition (e.g., tools required, fault type, etc.). In some embodiments, notifying building occupants includes emitting a flashing light or sound to indicate to building occupants than a fault has been detected. These notifications may resemble the notifications emitted by fire notification devices. Process 1250 is shown to include providing progress updates through correction of an installation error (step 1258). Process 1250 is shown to include transmitting a completion message after correction of the installation error (step 1260). This may include actuator 1002 providing a completion message to users or building occupants (e.g., other HVAC technicians, supervisors, workers, etc.) once the HVAC technician has completed the repair.

Referring now to FIG. 13, a process 1300 for correcting a fault in an HVAC system is shown, according to an exemplary embodiment. Process 1300 is shown to include determining a position of a drive device of an actuator (step 1302). In some embodiments, actuator 1002 receives position data regarding the position (e.g., location, rotation angle, etc.) of a drive device 1030. This may be determined by various sensors (e.g., sensors 1104).

Process 1300 is shown to include determining a power consumption of the motor (step 1304). In some embodiments measurements received by actuator 1002 include power measurements (e.g., 4.2 VA, 6 VA, etc.) from one or more power sensors when drive device 1030 is engaged. In other embodiments, actuator 1002 receives torque data (e.g., 150 in.-lb., 200 in.-lb., etc.) from one or more torque sensors.

Process 1300 is shown to include identifying an installation error associated with at least one of the actuator and the HVAC device based on a relationship between the position and the power consumption (step 1306). In some embodiments, actuator 1002 identifies an installation error based on receiving a power measurement that differs from the expected power measurement received. For example, to engage drive device 1030, actuator 1002 may expect to use power ranging from 5.5-5.9 VA. When power measurements provided to actuator 1002 indicate that the amount of power being used to engage drive device 1030 is 2.5 VA, actuator 1002 may determine that there is an installation error or fault condition. In the exemplified embodiment, a low power usage may indicate slippage between drive device 1030 and valve member 616. In other embodiments, actuator 1002 may receive power measurements that are higher than the predetermined range (e.g., 7.5 VA). This may indicate a stuck valve member.

In some embodiments, detecting a fault condition may be based on historical movements of actuator 1002 (e.g., identified pattern), present position, and motor power. This may include training data generated and stored over time on actuator 1002. This data is not limited to present position and motor power and can include data relating to any operational or functional parameter of actuator 1002 over any period of time.

Process 1300 is shown to include transmitting a message to a remote device based on identifying the installation error (step 1308). Once a fault (e.g., slippage, over-tightening, stuck valve member, backwards installation, etc.) is detected, actuator 1002 may implement various corrective actions. For example, if a fault of backwards installation is detected, actuator 1002 will modify a control program to reverse the rotation of rotating valve member 616. In another example, if a stuck valve member is detected, actuator 1002 may attempt to move the drive device back and forth to loosen valve member 616.

Actuator 1002 may transmit various updates based on both the fault detected (e.g., an installation error) and the corrective action taken to correct the fault. Actuator 1002 may also transmit whether the corrective action was successful. For example, when a fault is detected (e.g., backwards installation), actuator 1002 transmits "ACTUATOR HAS BEEN INSTALLED OR IS OPERATING BACK-WARDS." Actuator 1002 may then engage in corrective action and transmit, "CORRECTIVE ACTION: ATTEMPT-ING TO REVERSE POLARITY OF CONTROL SIGNAL." In the event that actuator 1002 corrects the installation error, actuator 1002 transmits, "SOLVED: CORRECTIVE ACTION SUCCESSFUL." These and other various messages may be transmitted to one or more users (e.g., HVAC technicians, electrical contractors, etc.) at various stages throughout the fault detection and correction process. Messages, notifications, updates, and various other transmittals may be provided to user interface 1102.

In some embodiments actuator 1002 may transmit a message that indicates the corrective action was unsuccessful. This message may include, "NOT SOLVED: CORRECTIVE ACTION UNSUCCESSFUL." In such an embodiment, actuator 1002 may provide a substantial amount (e.g., 10 kB, 50 kB, 1 gB) of data to a user device for analysis of the fault condition. This data may include information on actuator operation over time, including power consumption, torque levels, current draw, operating voltage, and various other parameters.

In some embodiments, the information from actuator 1002 may be communicated from actuator 1002 through a building network (e.g., network 446) to mobile access point (MAP) devices. MAP devices may be portable devices capable of communicating with various user devices over the network (e.g., network 446). In some embodiments, an HVAC technician may use a MAP device to determine the operational status of an HVAC device (e.g., actuator and valve assembly as shown in FIG. 11A).

In some embodiments, actuator 1002 may be installed prior to complete installation of the building management system (BMS). In such an embodiment, actuator 1002 may not be connected to a building network (e.g., BACnet/IP, BACnet/MSTP, Zigbee, etc.) that allows actuator 1002 to operate normally. As such, an HVAC technician or other building occupant may use a MAP device to connect to actuator 1002 to determine if actuator 1002 is capable of operation properly under normal conditions. For example, an HVAC technician may connect a MAP device to actuator 1002 to determine if actuator 1002 is capable of sending a fault notification over the network, as actuator 1002 is now capable of accessing the network via the MAP.

Referring now to FIG. 14, a process 1400 for predicting a fault event and entering a soft-fail state is shown, according to an exemplary embodiment. Process 1400 may be performed by actuator 1002 or any other processing component within system 1100. Process 1400 is shown to include controlling a motor to move a drive device in accordance with a setpoint from an external control system (step 1402). Process 1400 is shown to include monitoring a plurality of actuator attributes (step 1404). In some embodiments, fault predictor 1110 monitors actuator attributes (e.g., operational parameters) including voltage levels, current draw, power output, position, torque, and various other parameters.

Process 1400 is shown to include predicting a fault event based on the plurality of actuator attributes (step 1406). In some embodiments, fault predictor 1110 predicts a fault within actuator 1002. In other embodiments, fault predictor 1110 may predict that a fault will occur in the future, and provide control decisions based on that prediction. For example, fault predictor 1110 may determine that, based on a higher power output at 70 degrees of rotation, actuator 1002 is encountering grease, dirt, or other stoppage that is making rotation for actuator 1002 difficult. As such, fault predictor 1110 may determine that, based on the increased levels of power output over time, actuator 1002 will reach a power level that will be too great for sustained normal operation of actuator 1002 and will thus cause damage. Actuator 1002 may then enter a state (e.g., soft-fail state) to mitigate this, notify building occupants of the situation, or both.

Process 1400 is shown to include controlling, in response to a prediction of the fault event, the motor to move the drive device to a soft-fail state configured to mitigate the fault event (step 1408). In some embodiments, fault predictor 1110, upon predicting that a fault may occur, may send a signal to state determiner 1120 as shown in FIG. 11B to enter a soft-fail state. The soft-fail state may change the operational parameters of actuator 1002 such that the predicted fault may be mitigated or avoided entirely. In other embodiments, state determiner 1120 enters a soft-fail state after already experiencing a fault, and changes operational parameters to mitigate the fault.

In some embodiments, actuator 1002 can detect various fault conditions, including reverse operation of actuator 1002, a stuck valve, actuator 1002 being stuck, installation errors, and various others. Reverse operation of actuator 1002 may be a result of incorrect installation of actuator 1002, incorrect installation of valve assembly 600, incorrect wiring, or any combination thereof. In some embodiments actuator 1002 can engage in corrective action in an attempt to correct the various fault conditions detected by actuator 1002. This may include control program module 1130 reversing the control polarity of actuator 1002, notifying users or building occupants of the fault, and various other actions. In some embodiments, actuator 1002 will store the corrective actions taken to correct the detected fault conditions for more efficient fault correction in the future.

One or more "soft-fail states," as described herein, may include various degrees of limiting operation of a device (e.g., actuator 1002) to mitigate safety concerns or improve operation of system 1100. Soft-fail states may including limiting a range of motion of actuator 1002. For example, actuator 1002 may typically rotate between 0 degrees and 180 degrees. When actuator 1002 enters into a soft-fail state, actuator 1002 may only be configured to rotate between 0 degrees and 90 degrees. Soft-fail states may further include moving actuator 1002 to a predetermined position (e.g., open, closed, half-way open/closed, etc.). In some embodiments, soft-fail states include limiting torque output.

In various embodiments, soft-fail states may be dependent on the location of HVAC device. For example actuator 328 proximate to air duct 312 may include a soft-fail state that opens to half-way, such that air can still pass through air duct 312, while actuator 1002 may include a soft-fail state that closes, such that fluid can no longer pass through valve body 612. In some embodiments, soft-fail states may be dependent on the type of HVAC device. For example, actuator 1002 may include a soft-fail state that closes, such that fluid can no longer pass through valve body 612, motor 338 may include a soft-fail state that allows motor 338 to blow at a constant low-power operation.

In some embodiments, the term fluid may include various forms of a substance that lacks a fixed shape and yields to external pressure. In some embodiments, fluid may be water, various gasses (e.g., air, natural gas, steam, etc.), or multiple phase fluids. In some embodiments, fluids are used to serve thermal energy loads of an HVAC system (e.g., HVAC system 100, etc.).

In some embodiments, the various flow regulation devices disclosed herein may refer to various HVAC devices (e.g., valves, dampers, etc). However, while various exemplary embodiments disclosed herein refer to actuator assemblies coupled to HVAC devices, various flow regulation devices can be considered and the embodiments disclosed herein are not limited to HVAC devices.

Figure 15:
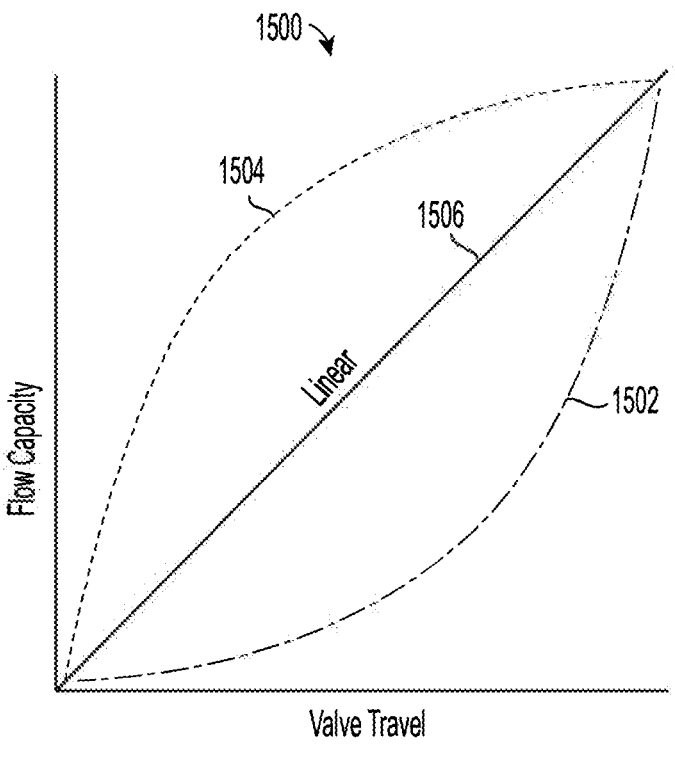
FIG. 15 is a graph of illustrating a function of linearizing a valve characteristic, according to some embodiments.

Referring now to FIG. 15, a graphical representation relating to linearizing flow control for a valve is shown, according to some embodiments. In particular, FIG. 15 shows a graph 1500 with valve travel plotted on the horizontal axis (e.g., valve position as a percentage of a total travel between fully closed (0%) and fully open (100%) and flow capacity on the vertical axis. A first line 1502 plots an actual relationship between valve position and flow capacity, in some examples. A second line 1504 plots an actual relationship between valve position and flow capacity in other examples. The first line 1502 and the second line 1504 illustrate that the relationship between valve position and flow capacity is often non-linear and can depend on the mechanical configuration of the valve, upstream and downstream components, fluid viscosity, etc., and may thus may vary between uses of the actuator 1002 such that the relationship is not known at the time of manufacturing.

Accordingly, in the example of FIG. 15, the control chip 1011 (e.g., the control program module 1130 thereof) is configured to "linearize" the flow control curve. A process of valve linearization can be executed by the control chip 1011 so that the control logic executed thereon can be programmed to control the drive device 1030 while easily adjusting for the non-linearity illustrated in FIG. 15. For example, the control chip 1011 may move the valve through a full range of motion while collecting data from sensors 1104 which is indicative of an actual flow rate across the valve body 612 (through the valve assembly 600), and can use that data to numerically generate a mapping of valve position (and, accordingly, drive device 1030 positions) to flow rate, for example to shift valve position commands in a way that results in a linear relationship shown by the third line 1506 on the graph 1500. That mapping can then be used to reconfigure the control logic executed by the control chip 1011 so that the control chip 1011 is able to control the drive device 1030 to achieve desired flow rates. Because the control chip 1011 includes reprogrammable control logic (software), such an approach is greatly simplified as compared to redeveloping and validating actuator firmware as may be required in other approaches.

Referring now to FIG. 16, a diagram showing the architecture of a system 1600 including the actuator 1002 is shown, according to some embodiments. The system 1600 includes the actuator 1002 operating valve 600 to affect the flow of fluid through a heat exchanger 1602 (e.g., heating coil, cooling coil) across which a fan 1604 blows air to facilitate heat transfer. The valve 600 may act as an expansion valve. The system 1600 also includes sensors 1104, shown as an inlet sensor 1104a measuring a supply temperature to the heat exchanger 1602 and an outlet sensor 1104b measuring a return temperature after fluid flow through the heat exchanger. The sensors 1104 are also shown as including a thermostat 1104c/1102 configured to measure air temperature, humidity, pressure, carbon dioxide level, pollution level, etc. (e.g., in a space heated or cooled by the system 1600) and to display information to a user (e.g., current temperature, temperature setpoint, etc.). In the example shown, the sensors 1104 have a wired (conductive) connection to the actuator 1002. In other examples, some or all of the sensors 1104 communicate wirelessly with the actuator 1002.

The system 1600 is also shown as including IT system including a wireless router 1606, an application data server 1608, client devices 1610, and cloud resources 1612. The application data server 1608, client devices 1610, and cloud resources 1612 are shown as communicable with the wireless router 1606 via Ethernet, Internet, and/or Intranets. The wireless router 1606 provides a wireless access point and generates a wireless IT network (e.g., WiFi network) to which the actuator 1002 can connect in the embodiment shown. A wireless connection between the actuator 1002 and the wireless router 1606 allows communication between the actuator 1002 and the application data server 1608, client devices 1610 (e.g., located remote from a building served by the actuator 1002), and cloud resources 1612 without requiring a building network (e.g., BACnet, MSTP, etc.) or other wired connection to the actuator 1002.

The system 1600 is also shown as including mobile device 1614 (e.g., smartphone, tablet, etc.). As shown the mobile device 1614 is also communicable via wireless networks, for example a wireless network generated by the wireless router 1606 to which the actuator 1002 is connected, or via a wireless network generated by the wireless interface 1160 of the actuator 1002. The mobile device 1614 is able to access the web server hosted by the actuator 1002 via the wireless network (e.g., via the wireless router 1606, directly via a network provided by the actuator 1002). The web server of the actuator 1002 can thereby be accessed by a standard user mobile device, i.e., without requiring user to have a specialized mobile access point device or other specialized equipment.

As shown in FIG. 16, the actuator 1002 is configured to both actuate the valve 600 and control the fan 1604 using data from inlet sensor 1104a, outlet sensor 1104b, and thermostat 1104c. The actuator 1004 is thereby able to affect the amount of heat flow into or out of a space (room, zone, insulated refrigerator case, etc.) served by the heat exchanger 1602. Various control logic for unified, coordinated control of the fan 1604 and the valve 600 can be executed by the actuator 1002 in various embodiments.

The application data server 1608, the client devices 1610, and the cloud resources 1612 can integrate the actuator 1002 into a building management system, provide supervisory control signals or other control inputs to the actuator 1002, obtain operating data from the actuator 1002 (e.g., data from sensors 1104, data relating to control decisions made by the actuator 1002, etc.), and generate metrics, performance indicators, etc. relating to the actuator 1002 and other devices connected to the application data server 1608, client devices 1610, and/or cloud resources 1612. Advantageously, the architecture illustrated in FIG. 16 omits multiple intermediary devices and networks (e.g., building automation control buses and networking hardware, stand-alone controllers, etc.) that are present in other implementations, thereby reducing the amount of devices that need to be installed, maintained, operated, etc. to enable the various use cases described herein.

Referring now to FIG. 17, an example client device 1610 is shown displaying a dashboard 1700. In the example show, the dashboard 1700 is provided (generated, hosted, etc.) by the web server 1150 of the control chip 1101 of the actuator 1002. The client device 1610 can access the web server 1150 via the wireless router 1606, for example over an internet connection to the wireless router 1606 and a wireless network connecting the wireless router 1606 and the actuator 1002.

The dashboard 1700 shows various data obtained by, generated by, or otherwise relating to operation of the actuator 1002. In the example shown, the dashboard provides a visualization of a water inlet temperature (e.g., as measured by sensor 1104a), a water outlet temperature (e.g., as measured by sensor 1104b), a valve position (e.g., measured on a percentage scale from closed to fully open), a flow rate through the valve (e.g., estimated based on valve position, measured by a meter communicable with the control chip 1101), and an energy consumption associated with the actuator 1002 (e.g., an amount of heat transferred by the heat exchanger 1602, a power consumption of the fan 1604 and/or the actuator 1002). The dashboard 1700 thereby provides a user with direct access to data relating to the actuator 1002.

The dashboard 1700 is also shown as including an on/off toggle 1702. The on/off toggle 1702 allows a user to turn the actuator 1002 on or off via the dashboard 1700 and the web server 1150. In some examples, the actuator 1002 moves to an extremum (e.g., completely closed valve, completely open valve) or maintains a current position (e.g., control of the motor to move the drive member is stopped) when turned "off" via the dashboard 1700.

The dashboard 1700 is also shown as including a setpoint adjustment widget 1704. In the example shown, the setpoint adjustment widget 1704 allows a user to adjust a delta temperature setpoint which represents a setpoint for the drop in temperature across the heat exchanger 1602 (i.e., a difference between the water inlet temperature and the water outlet temperature measured by sensors 1104a-b). The control chip 1101 (e.g., the control program module 1130) may use the delta temperature setpoint to modify a valve position (i.e., operate the drive device 1030) as a function of measured temperatures, for example to drive a temperature drop across the heat exchanger 1602 to the delta temperature setpoint. Other examples of adjustable setpoints are possible. The setpoint adjustment widget 1704 allows a user to change a setpoint used by control chip 1101 to control the device 1030. The dashboard 1700 is thereby configured to enable a user to adjust control logic for the control chip 1101 via the web server 1150.

In some examples, the dashboard 1700 allows a user to select different control modules to be executed by control chip 1101. For example, in some embodiments, the setpoint adjustment widget 1704 provides an interactive feature whereby a user can change the setpoint used by the control chip 1101. As one example, the dashboard 1700 may allow a user to switch a control strategy from using the delta temperature setpoint to using a measured room air temperature or humidity (or other variable), and then select a setpoint for the newly-selected variable. In some examples, the dashboard 1700 may also allow a user to add additional control widgets, alarm widgets, fault detection and diagnostic widgets, etc. to the dashboard 1700 in order to activate corresponding control, alarm, fault detection, etc. logic to be executed by the control chip 1101. A large variety of different programming modules/widgets may be available for quick customization of the control chip 1101 and the dashboard 1700 by a user.

Referring now to FIG. 18, an example view of mobile device 1614 is shown, according to an example embodiment. The mobile device 1614 is shown as a smartphone, but may be a tablet, laptop, virtual or augmented reality headset, etc. in various embodiments. In the example here, the mobile device 1614 and the actuator 1002 are communicable over a wireless network 1002, for example a wireless network hosted by the wireless interface 1160 of the control chip 1101 (shown in FIG. 11B). The mobile device 1614 may be a standard smartphone or other personal computing device including WiFi or other wireless communications capabilities and a web browser application.

In the example of FIG. 18, the mobile device 1614 displays a mobile dashboard 1800. The mobile dashboard 1800 may be a web page hosted by the web server 1150 of the control chip 1101 of the actuator 1002. In some embodiments, the mobile device 1614 includes a web browser application that allows for navigation to the mobile dashboard 1800 hosted by the web server 1150. For example, the mobile device 1614 and the web server 1150 may communicate using hypertext transfer protocol (HTTP) or hypertext transfer protocol secure (HTTPS). The web server 1150 may be associated with a uniform resource locator (URL) such that a browser application of the mobile device 1614 can use the URL to access the web server 1150 via HTTP or HTTPS.

In other examples, the web server 1150 operates to provide information to a remote computing resource (e.g., cloud resource 1612, application data server 1608) which then generates a user interface (e.g., mobile dashboard 1800)

to display such information. The web server 1150 may use a protocol such as MQTT to communicate with the remote communication resource. In some examples, the mobile device 1614 may store and execute a dedicated application for viewing the mobile dashboard 1800, for example with the mobile application receiving data from the web server 1150 (e.g., using MQTT) and generating a user interface locally on the mobile device 1614.

As shown in FIG. 18, the mobile dashboard 1800 shows various data obtained by, generated by, or otherwise relating to operation of the actuator 1002, and can provide the various features described above for the dashboard 1700 of FIG. 17 in various embodiments. In the example shown, mobile dashboard 1800 displays in indoor air temperature, relative humidity, and carbon dioxide level (e.g., measured by sensor 1104c in the example of FIG. 16), an occupied/ unoccupied status of a space (e.g., as detected by an occupancy detector communicable with the actuator 1002), an inlet temperature (e.g., as measured by sensor 1104a) and an outlet temperature (e.g., as measured by sensor 1104b).

The mobile dashboard 1800 also includes a valve command widget 1802 which shows a current valve position and an indication of a duration since the last change in valve position. The valve command widget 1802 may be a damper position widget or other appropriate widget for different uses of the actuator 1002. In some embodiments, the valve command widget 1802 is selectable to open a exploded view in which the user can directly control the drive device 1030 (e.g., by selected a desired valve position), edit a setpoint or other parameter used for control of the drive device 1030, or activate or deactivate various control logic modules for the actuator 1002. The mobile dashboard 1800 is thereby structured to allow a user to affect the operation of the actuator 1002 via the web server 1150 provided on the control chip 1101.

Referring now to FIG. 19, a block diagram of a system architecture 1900 for programming and reprogramming control chip 1101 is shown, according to some embodiments. In some embodiments the system architecture 1900 of FIG. 19 is a portion of the system 1600 of FIG. 16. The system architecture is shown as including the control chip 1101, the wireless router 1606, and a programming system 1902. The programming system 1902 can be an element of the application data server 1608, the client devices 1610, and/or the cloud resources 1612 in various embodiments.

As shown in FIG. 19, the programming system 1902 is communicable with the control chip 1101 via the wireless router 1606. The programming system 1902 is shown as including a database of predefined control blocks 1904 and a selector and configurator tool 1906. The predefined control blocks 1904 include a plurality selectable control blocks that enable a variety of different, selectable control functions that can be executed by the control chip 1101 if and when activated. For example, the predefined control blocks 1904 may include various control logic for controlling drive device 1030 based on different sensor inputs (e.g., measured supply or return air or water temperatures, air temperature, humidity, carbon dioxide levels, pressure, etc.) or other variables (time, day of week, occupancy, building schedules, etc.). The predefined control blocks 1904 can also include logic for trigging alarms, generating performance metrics, or performing fault prediction, detection, or diagnosis functions. The predefined control blocks 1904 are pre-programmed, debugged, tested, and validated during or before production, so that any of the control blocks 1904 can be selected in an appropriate scenario and provided validated, reliable behavior for the control chip 1101 and the actuator 1002. Each predefined control block stored by the programming system 1902 may include executable code that provides the corresponding functionality when executed by a processor of the control chip 1101.

The selector and configurator tool 1906 is structured to provide a user with the ability to select (e.g., activate) one or more of the predefined control blocks 1904 to be executed by the control chip 1101 and to configure any adjustable settings associated with the selected control blocks. In response, the programming system 1902 can push the selected control block (e.g., executable code enabling the selected functionality) to the control chip 1101 via the wireless router 1606. The selector and configurator tool 1906 can also enable the user to deselect (deactivate, delete) control blocks already active on the control chip 1101.

In some examples, the selector and configurator tool 1906 provides a user interface (e.g., via a client device 1610) that allows a user to select control blocks (e.g., from a list) for activation and to input any necessary settings or parameters (e.g., desired setpoints). In some embodiments, a drag-and-drop interface is provided where a user can drag a desired control block from the set of predefined control blocks 1904 into an area delineated as corresponding to the control chip 1101 (i.e., to the actuator 1002) to cause that control block to be activated on the control chip 1101.

The system architecture 1900 thereby enables quick reprogramming of control logic for the control chip 1101 without requiring software coding expertise, reengineering of firmware, or additional testing. Such a system can enable customization and reprogramming after delivery and/or installation, and can enable the same hardware and firmware to be used for a large number of use cases.

Figure 20:
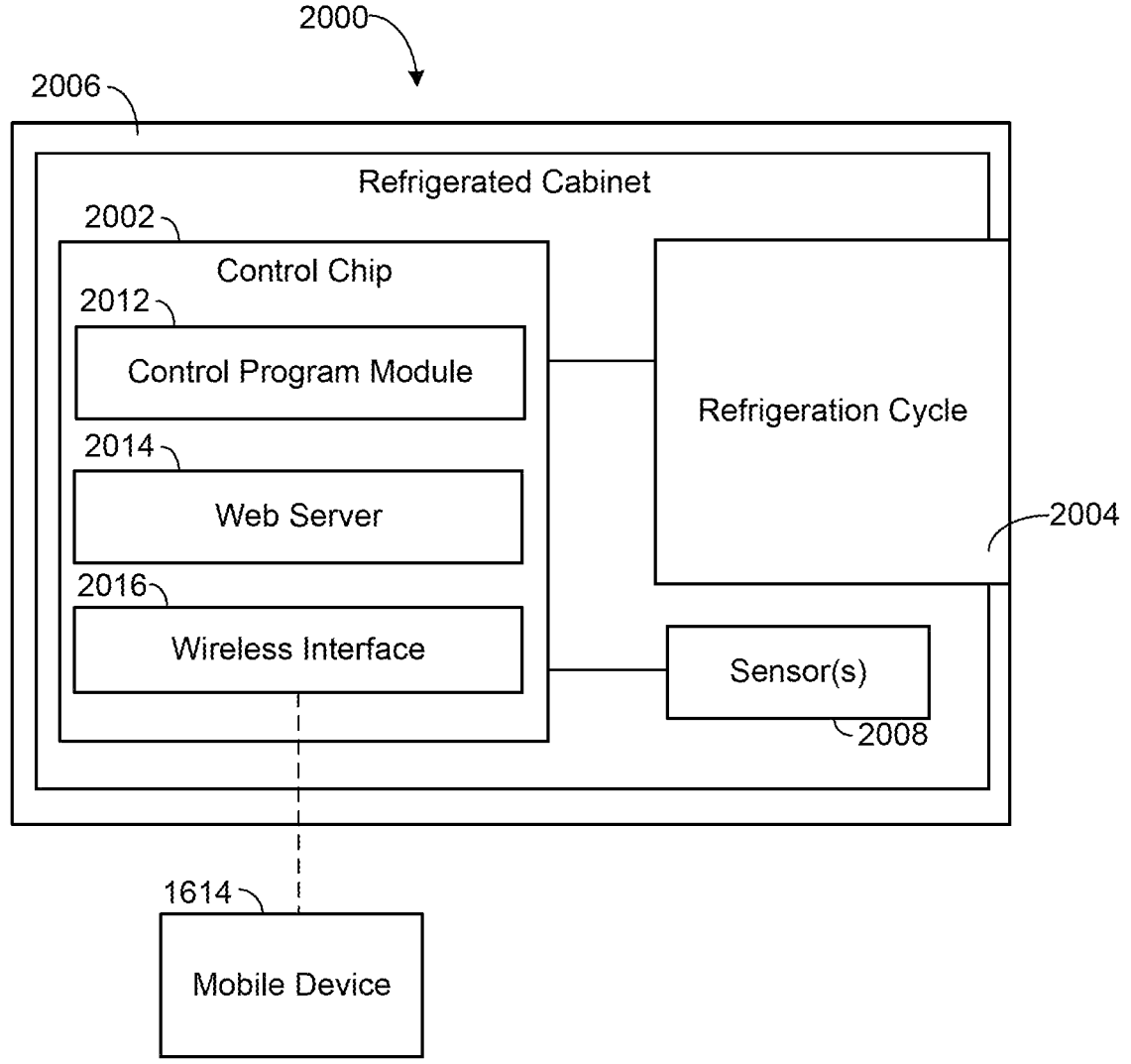
FIG. 20 is an illustration of a refrigerated cabinet and a control chip thereof, according to some embodiments.

Referring now to FIG. 20, a refrigerated cabinet 2000 including a control chip 2002 is shown, according to some embodiments. The refrigerated cabinet 2000 also includes a refrigeration cycle 2004, a case 2006 defining a space cooled by the refrigeration cycle 2004, and one or more sensors 2008 (e.g., positioned in the case 2006). The control chip 2002 provides control signals to the refrigeration cycle 2004 and receives measurements from the sensors 2008. FIG. 20 also shows a mobile device 1614 in wireless communication with the control chip 2002, in particular with a wireless interface 2010 of the control chip 2002. The control chip 2002 is also shown as including a control program module 2012 and a web server 2014.

The case 2006 may be an insulated box, display case (e.g., grocery store freezer or cooler case), walk-in freezer or cooler, etc. As such, the case 2006 and refrigerated cabinet 2000 may be different sizes in various embodiments. The case 2006 may include one or more doors which can be opened to access an interior of the case 2006. The refrigeration cycle 2004 includes a compressor, an evaporator inside the case 2006, an expansion valve, and a condenser outside the case, such that the refrigeration cycle 2004 is configured to remove heat from the interior of the case 2006. The refrigeration cycle 2004 may be operable to achieve various temperatures below ambient temperature in various embodiments, including significantly below freezing in some embodiments (e.g., at least as low as −40 C). Various components of the refrigeration cycle 2004 are controllable, for example the compressor (operable at various powers, rates, etc.) and the expansion valve (controllable to different positions to affect flow therethrough). The control chip 2002 may be positioned in the refrigerated cabinet 2000 such that it is exposed to such temperatures, and may be made of materials suitable for prolonged exposure to temperatures at least as low as −40 C, for example.

The one or more sensors 2008 can be or include a temperature sensor that measures a temperature inside the case 2006, a humidity sensor measuring humidity in the case 2006, sensors measuring traits of a fluid as it flows through the refrigeration cycle 2004 (e.g., measuring inlet fluid temperature and outlet fluid temperature across the evaporator), a door open sensor detecting when a door of the case 2006 is open, energy meter measuring energy consumption of the refrigeration cycle 2004, etc.

The control chip 2002 includes a control program module 2012, web server 2014, and wireless interface 2016, which are structured to provide many of the functionalities described above with respect to the control program module 1130, web server 1150, and wireless interface 1160 of the actuator 1002. The control program module 2012 is configured to execute reprogrammable control logic to generate control signals for the refrigeration cycle 2004 and, in some examples, provide various alarms, metrics, predictions, diagnoses, etc. The control program module 2012 can be reprogrammed with selectable control blocks as described with reference to FIG. 19, for example to provide different control logic based on various inputs from the one or more sensor(s) 2008, different temperature requirements for the refrigerated cabinet 2000 (e.g., based on different products stored therein), etc. The web server 2014 provides a dashboard that visualizes data relating to operation of the refrigerated cabinet and allows selection of various setpoints, parameters, control limits, predefined control blocks, etc. for use by the control chip 2002. The wireless interface 2016 provides a wireless network to enable communication between the mobile device 1614 and the wireless interface, for example via WiFi and/or using HTTP or HTTPS.

The control chip 2002 of the refrigerated cabinet 2000 thereby enables easy access by a user to data relating to operation of the refrigerated cabinet 2000, and allows the user to modify control of the refrigeration cycle 2004 by the control chip 2002 without coding or programming expertise. Allowing directly access to such data and control options at the edge can enable easy customization during or after installation/delivery of the refrigerated cabinet 2000 and avoid requirements for additional connectivity between the refrigerated cabinet 2000 and an external network. Inclusion of the control chip 2002 in refrigerated cabinet 2000 is therefore advantageous.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An actuator, comprising:
a motor;
a drive member coupled to the motor and structured to transfer movement from the motor to an external mechanism; and
a control chip coupled to the motor and configured to:
host a web server, wherein the web server provides a web page;
provide access to the web page via a wireless communication network; and
control the motor using reprogrammable control logic, wherein the reprogrammable control logic is adjustable by a user via the web page.

2. The actuator of claim 1, wherein the web page is configured to provide a dashboard showing visualizations relating to operation of the actuator.

3. The actuator of claim 1, wherein the web page provides an option to change a setpoint for the reprogrammable control logic.

4. The actuator of claim 1, wherein the actuator comprises a housing containing the motor and the control chip, wherein the web server enables a user device to access the web page via the wireless communication network without requiring an Internet connection.

5. The actuator of claim 1, wherein the control chip comprises an input pin configured to receive a signal from a sensor.

6. The actuator of claim 5, wherein the reprogrammable control logic causes the control chip to control the motor as a function of the signal from the sensor.

7. A system comprising:
a personal computing device; and
an actuator comprising:
a motor;
a drive member coupled to the motor and structured to transfer movement from the motor to an external mechanism; and
a control chip coupled to the motor and configured to:
host a web page;
provide the personal computing device with direct access to the web page via a wireless communication network; and
control the motor using reprogrammable control logic, wherein the reprogrammable control logic is reprogrammable via user inputs to the web page via the personal computing device.

8. The system of claim 7, further comprising a supervisory controller of a building management system, wherein the supervisory controller is communicable with the control chip via the wireless communication network and is configured to provide a parameter used by the reprogrammable control logic.

9. The system of claim 8, further comprising a cloud-based computing resource, wherein the supervisory controller and the personal computing device are communicable with the cloud-based computing resource.

10. The system of claim 7, further comprising a fan, wherein the control chip is configured to control a speed of the fan.

11. The system of claim 10, wherein the actuator further comprises a housing containing the motor and the control chip.

12. The system of claim 10, wherein the personal computing device stores a plurality of selectable control modules and allows a user to reprogram the control chip by selecting a subset of the selectable control modules for the control chip to execute.

13. A refrigerated cabinet, comprising:
a refrigeration circuit; and
a thermostat coupled to the refrigeration circuit and comprising a control chip configured to:
host a web server, wherein the web server provides a web page;
provide access to the web page via a wireless communication network;
control operation of the refrigeration circuit using reprogrammable control logic; and
provide information relating to the operation of the refrigeration circuit on the web page.

14. The refrigerated cabinet of claim 13, wherein the web server is configured to provide the information as a dashboard on the web page.

15. The refrigerated cabinet of claim 13, wherein the reprogrammable control logic is reprogrammable via the web server and the wireless communication network based on user inputs to the web page via a personal computing device communicating with the web server without requiring an Internet connection.

16. The refrigerated cabinet of claim 15, wherein the reprogrammable control logic is reprogrammable by activating a subset of a plurality of selectable control modules and deselecting a remainder of the selectable control modules.

17. The refrigerated cabinet of claim 16, wherein the plurality of selectable control modules define a plurality of different control logic comprising temperature feedback control logic, temperature alarm logic, defrost logic, and fault detection logic.

18. The refrigerated cabinet of claim 13, comprising a case defining a volume cooled by the refrigeration circuit, wherein the thermostat is positioned in the case.

19. The refrigerated cabinet of claim 18, wherein the case is a refrigerated display case.

20. The refrigerated cabinet of claim 18, wherein the case defines walls of a walk-in freezer and the control chip is configured to operate at temperatures at least as low as −40 C.

\* \* \* \* \*